(12) United States Patent
Nagahama et al.

(10) Patent No.: US 7,514,843 B2
(45) Date of Patent: Apr. 7, 2009

(54) PIEZOELECTRIC ACTUATOR AND DEVICE

(75) Inventors: Reiko Nagahama, Shiojiri (JP); Yutaka Yamazaki, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 480 days.

(21) Appl. No.: 11/175,165

(22) Filed: Jul. 7, 2005

(65) Prior Publication Data

US 2007/0188048 A1 Aug. 16, 2007

(30) Foreign Application Priority Data

Jul. 7, 2004 (JP) ............................. 2004-200794

(51) Int. Cl.
*H01L 41/04* (2006.01)
*H02N 2/00* (2006.01)
(52) U.S. Cl. .............. 310/317; 310/323.01; 310/323.19
(58) Field of Classification Search ......... 310/363–366, 310/316.01, 317, 323
See application file for complete search history.

(56) References Cited

U.S. PATENT DOCUMENTS

| 5,821,667 | A | * | 10/1998 | Takagi et al. ................. 310/317 |
| 6,104,123 | A | | 8/2000 | Okazaki et al. |
| 7,183,691 | B2 | * | 2/2007 | Yamamoto ............. 310/316.01 |
| 2004/0080243 | A1 | * | 4/2004 | Miyazawa ................... 310/328 |
| 2008/0036333 | A1 | * | 2/2008 | Funakubo et al. ....... 310/323.02 |

FOREIGN PATENT DOCUMENTS

| JP | 2000-4590 A | 1/2000 |
| JP | 2002-291264 A | 10/2002 |
| JP | 2003-304693 A | 10/2003 |

* cited by examiner

*Primary Examiner*—Jaydi SanMartin
(74) *Attorney, Agent, or Firm*—Global IP Counselors, LLP

(57) ABSTRACT

A generally diamond-shaped detection electrode is formed in the approximate center of the piezoelectric element. The strain resulting from the bending secondary vibration mode in the vicinity of the detection electrode is minimized because the detection electrode is formed in such a manner as to include a vibrational node of the longitudinal primary vibrational mode and a vibrational node of the bending secondary vibrational mode. As a result, when the phase difference between the drive signal and the detection signal is detected, the effect of vibration in the bending secondary vibration mode on the detected phase difference can be suppressed and a single drive frequency can be determined with respect to a prescribed phase difference. Thus, the drive performance of the vibrating body with respect to a driven body (i.e., a body driven by the vibrating body) can be reliably improved because, by controlling the drive frequency such that the phase difference equals a prescribed value, the vibrating body can be made to vibrate at a desired frequency and vibrate in such a manner that the desired vibration components are achieved in each vibration mode.

19 Claims, 23 Drawing Sheets

PIEZOELECTRIC ACTUATOR AND DEVICE

TECHNICAL FIELD

The present invention relates to a piezoelectric actuator configured to drive a driven body by means of the vibration of a piezoelectric element and a device equipped with the piezoelectric actuator.

BACKGROUND ART

Some piezoelectric actuators that drive a driven body by means of the vibration of a piezoelectric element are configured to excite a plurality of vibration modes of the piezoelectric element and utilize a combination of these vibration modes to drive the driven body. In order to obtain the desired vibrational path and drive force, such piezoelectric actuators must be designed to maintain the vibration components of each vibration mode in an appropriate manner. As a means of satisfying this requirement, methods have been proposed whereby the drive signal applied to the piezoelectric element is controlled based on a phase difference between the drive signal and a detection signal obtained by detecting the vibrations of the piezoelectric element (see Patent Document 1, for example). The piezoelectric actuator in Patent Document 1 is provided with a detection electrode so that the phase difference between the drive signal applied to the piezoelectric element and the detection signal detected from the detection electrode can be monitored. By adjusting the drive frequency of the drive signal applied to the piezoelectric element such that a prescribed phase difference value is obtained, the vibration components of the different vibration modes of the piezoelectric actuator are controlled appropriately and the driven body is driven in an efficient manner.

[Patent Document 1] Japanese Laid-open Patent Publication No. 2002-291264 (pages 12 and 13, FIGS. 26 and 27)

OBJECT THE INVENTION IS TO ACHIEVE

With the piezoelectric actuator described in Patent Document 1, the detection signal detected at the detection electrode results from the vibrations of a plurality of vibration modes being detected simultaneously. Consequently, the phase difference changes in the vicinity of the resonance frequency of vibration in each of the vibration modes and there are cases in which more than one vibration frequency corresponds to the prescribed phase difference deemed to be the optimum phase difference.

For example, FIG. 31 shows a phase difference versus dive frequency characteristic for a piezoelectric actuator in accordance with Patent Document 1. The piezoelectric actuator has a longitudinal primary vibration mode in which the piezoelectric element elongates and contracts in the lengthwise direction and a bending secondary vibration mode in which the piezoelectric element bends in a direction substantially perpendicular to the vibration direction of the longitudinal primary vibration mode. As shown in FIG. 31, the phase difference is high in the vicinity of the resonance frequencies f1, f2 of vibration in the respective vibration modes. Consequently, there are more than one drive frequency (three drive frequencies fb1, fb2, fb3 in FIG. 31) that correspond to the prescribed phase difference θ0 being targeted in order to control the piezoelectric actuator.

Since there is not a single unique drive frequency value to which the drive frequency can be controlled in order to achieve the prescribed phase difference value θ0, there are times when a vibration mode having the desired vibration component ratio cannot be obtained and the reliability of the drive performance of the piezoelectric actuator is poor.

The object of the present invention is to provide a piezoelectric actuator having improved reliability of drive performance and a device equipped with such a piezoelectric actuator.

MEANS OF ACHIEVING THE OBJECT

A piezoelectric actuator in accordance with the present invention is a piezoelectric actuator configured to drive a driven body by means of the vibration of a piezoelectric element having two or more vibration modes, the piezoelectric actuator being provided with a drive electrode for applying a drive signal to the piezoelectric element and thereby causing the piezoelectric element to vibrate; a detection electrode for detecting the vibrational behavior of the piezoelectric actuator, and a control means configured to control the drive signal applied to the drive electrode based on a phase difference between the drive signal and a detection signal detected at the detection electrode, said detection electrode being formed in such a position that the phase differences resulting from vibration modes other than a main vibration mode are smaller than a target phase difference that is targeted in order to execute said control of the drive signal.

With this invention only the phase difference resulting from the main vibration mode being used is controlled to the target phase difference value because the phase differences resulting from vibration modes other than the main vibration mode are smaller than the target phase difference due to the position in which the detection electrode is formed. Consequently, since a single drive frequency can be determined with respected to the target phase difference, the control means can adjust the drive signal in an optimum manner by controlling the frequency of the drive signal based on the target phase difference. As a result even when a piezoelectric actuator having a plurality of vibration modes is used, each vibration component can be adjusted appropriately and the reliability of the drive performance can be improved.

Also, since the detection electrode detects chiefly the vibration resulting from the main vibration mode being used, the vibration of the required vibration mode can be controlled more directly and the piezoelectric actuator can be controlled more precisely.

When there are three or more vibration modes, the detection electrode should be formed in such a position that the phase differences resulting from all vibration modes other than the main vibration mode being used are smaller than the target phase difference.

It is preferable for the detection electrode to be formed in such a position that the phase differences resulting from vibration modes other than the main vibration mode being used are 20 degrees or smaller.

It is a goal characteristic of piezoelectric actuators for the rotational speed to increase as the phase difference increases and the electric current consumption to decrease as the phase difference decreases. The target phase difference should be determined based on whether rotational speed or electric current consumption is considered more important depending on the specifications of the product. Since it can become difficult to drive the piezoelectric actuator if the phase difference is lowered too much in order to reduce the current consumption, the lower limit of the target phase different is approximately 20 degrees for most produces. Therefore, by positioning the detection electrode such that the phase differences resulting from vibration modes other than the main vibration mode being used are 20 degrees or smaller, a piezoelectric actuator that is usable in most products can be obtained and a variety of product specifications can be accommodated.

A piezoelectric actuator in accordance with the present invention is a piezoelectric actuator configured to drive a driven body by means of the vibration of a piezoelectric element having two or more vibration modes, the piezoelectric actuator being provided with a drive electrode for applying a drive signal to the piezoelectric element and thereby causing the piezoelectric element to vibrate; a detection electrode for detecting the vibrational behavior of the piezoelectric actuator; and a control means configured to control the drive signal based on the drive level of a detection signal detected at the detection electrode, said detection electrode being formed in such a position that the signal levels resulting from vibration modes other than a main vibration mode are smaller than a target signal level that is targeted in order to execute said control of the drive signal.

With this invention, only the signal level resulting from the main vibration mode being used is controlled to the target signal level value because the signal levels resulting from vibration modes other than the main vibration mode are smaller than the target signal level due to the position in which the detection electrode is formed. Consequently, since a single drive frequency can be determined with respect to the target signal level, the control means can adjust the drive signal in an optimum manner by controlling the frequency of the drive signal based on said single signal level. As a result, even when a piezoelectric actuator having a plurality of vibration modes is used, each vibration component can be adjusted appropriately and the reliability of the drive performance can be improved.

In the present invention, it is preferable for the detection electrode to be formed in such a position that portions of the piezoelectric element that elongate and portions of the piezoelectric element that contract due to the vibration modes other than the main vibration mode occur simultaneously and the electric charges that are generated at those portions cancel one another out.

A piezoelectric element generates a positive charge when compressed and a negative charge when elongated. If this characteristic is utilized by forming the detection electrode in a position where elongated portions and contracted portions resulting from vibration modes other than the main vibration mode are intermingled (ie., occur simultaneously), the positive and negative charges will cancel one another out and the detection signal level will be reduced. At the same time, the phase difference between the drive signal and the detection signal in the vicinity of the resonance frequency can be reduced.

Thus, with a detection electrode formed in a position where elongated portions and contracted portions resulting from vibration modes other than the main vibration mode are intermingled, the phase differences and signal levels resulting from said other vibration modes can be suppressed below the target phase difference and target signal level in a reliable fashion because the electric charges resulting from elongation and contraction cancel each other out and the phase differences and signal levels resulting from said other vibration modes can be reduced to small values.

In the present invention, it is preferable for the detection electrode to be formed in such a manner as to include the position where the strain resulting from vibration modes other than the main vibration mode being used is the smallest.

With this invention, since the detection electrode is formed in such a manner as to include the position where the strain resulting from vibration modes other than the main vibration mode being used is the smallest, the effect that vibrations resulting from vibration modes other than the main vibration mode have on the vibrational behavior detected by the detection electrode is held to a minimum and said detected vibrational behavior indicates chiefly the vibration resulting from the main vibration mode. Thus, since a single drive signal can be determined with respect to the phase difference or detection signal level, the control means can adjust (regulate) the drive signal in an optimum manner by setting a prescribed phase difference value or signal level value at which the appropriate vibration components of the main vibration mode are achieved and controlling the drive signal based on said prescribed phase difference or signal level. As a result, even when a piezoelectric actuator having a plurality of vibration modes is used, each vibration component can be adjusted appropriately and the reliability of the drive performance can be improved.

In the present invention, it is preferable for the vibration modes to include a longitudinal vibration mode in which the piezoelectric element elongates and contracts in a prescribed direction and a bending vibration mode in which the piezoelectric element bends in a direction substantially perpendicular to the vibration direction of the longitudinal vibration mode. It is also preferable for the detection electrode to be formed in a position that includes a vibrational node of the bending vibration mode.

With this invention, the vibration modes include a longitudinal vibration mode and a bending vibration mode. Since a longitudinal vibration mode generally provides a larger drive force than a bending vibration mode, a larger vibration force can be obtained by establishing the longitudinal vibration mode as the main vibration mode to be used. Since the detection electrode is formed in a position that includes a vibrational node of the bending vibration mode, the strain resulting from the vibration of the bending vibration mode is minimized at the detection electrode. Thus, chiefly the vibrational behavior of the longitudinal vibration mode is detected ad the detection electrode and precise control based on the vibrational behavior of the longitudinal vibration mode can be accomplished. As a result, a good drive force produced by the longitudinal vibration mode can be secured in a reliable manner.

In the present invention, it is preferable for the piezoelectric element to have the shape of a generally rectangular plate, for the vibrational modes to include a longitudinal primary vibration mode in which the piezoelectric element elongates and contracts along its lengthwise direction and a bending secondary vibration mode in which the piezoelectric element bends in a direction substantially perpendicular to the vibration direction of the longitudinal primary vibration mode, and for the detection electrode to be formed at a position the includes both a vibrational node of the longitudinal primary vibration mode and a vibrational node of the being secondary vibrational mode. With this invention, since the vibration modes include a longitudinal primary vibration mode and a bending secondary vibration mode, the piezoelectric element as a whole vibrates in such a manner as to move along a vibrational path that results from a combination of the longitudinal primary vibration mode and a bending secondary vibration mode. Since the detection electrode is formed at a position that includes both a vibrational node of the longitudinal primary vibration mode and a vibrational node of the bending secondary vibrational mode, the strain resulting from the vibration of the longitudinal primary vibration mode is maximal and the strain resulting from the bending secondary vibration mode is smallest at the position where the detection electrode is formed. Thus, chiefly the vibrational behavior of the longitudinal primary vibration mode is detected at the detection electrode and precise control based on the vibrational behavior of the longitudinal primary vibration mode can be accomplished. As a result, the appropriate vibration components of the longitudinal primary vibration mode can be obtained and the required drive force can be secured in a reliable fashion.

In the present invention, it is preferable for the piezoelectric actuator to be configured such that the vibration direction of the bending vibration mode can be switched between two opposite directions, ie., forward and reverse directions. With this invention, since the vibration direction of the bending vibrational mode can be switched between two opposite directions, the vibrational path can be switched between two opposite directions (forward and reverse) and thus the driven body can be driven in forward and reverse directions. As a result, the range of motions through which the driven body can be driven is widened. Also, since the detection electrode is formed in a position that includes a node of the bending vibration mode, the vibrational behavior of the longitudinal vibration mode can be detected in a favorable fashion even when the vibration direction of the bending vibration mode is reversed.

The bending vibration mode includes a bending secondary vibration mode. The longitudinal vibration mode includes a longitudinal primary vibration mode.

In the present invention, it is preferable for the surface area of the detection electrode to be equal to or larger than one thirtieth and smaller than or equal to one seventh of the surface area of the drive electrode.

With this invention, since the surface area of the detection electrode is set to an appropriate size, the detection electrode can be provided with the surface area necessary for detecting vibrations and a good drive force can be achieved by the piezoelectric actuator cause the surface area of the drive electrode is not excessively small in size. If the surface area of the detection electrode is smaller than one thirtieth of the surface area of the drive electrode, the surface area of the detection electrode will be too small to sufficiently detect the vibrations of the piezoelectric element. Meanwhile, if the surface area of the detection electrode is lager than one seventh of the surface area of the drive electrode, the surface area of the drive electrode will be comparatively too small and it will be difficult to secure the required drive force. Also, the larger surface area of the detection electrode will make it easy for the vibrations of vibration modes other than the main vibration mode to be detected, thereby decreasing the accuracy of the detection signal.

A device in accordance with the present invention is equipped with the piezoelectric actuator described heretofore. With this invention, the same effects are obtained as with the previously described piezoelectric actuator because the device is equipped with the previously described piezoelectric actuator. More specifically, since a single drive signal is determined with respect to the phase difference between the drive signal and the detection signal or the level of the detection signal, the control means can hold the drive signal constant by executing control such that the phase difference or detection signal level is held at a prescribed value and the vibration components of the different vibration modes can be controlled appropriately such that the reliability of the drive performance is improved. As a result, the operation of the device is stable.

In the invention, it is preferable for the device to be equipped with a lens and a drive unit configured to drive the lens by means of vibration of the piezoelectric actuator.

With this invention, a lens can be driven in a reliable manner because the device is equipped with a drive unit configured to drive the lens by means of the vibration of the piezoelectric actuator. This invention is particularly useful in, for example, a portable device or other small-sized device having a lens because even though the lens, too, is small, a comparatively large drive force is required; a piezoelectric actuator can provide a comparatively large drive force while having a small dimensional size.

In the present invention, it is preferable if the device is a timepiece configured to be driven by vibration of a piezoelectric actuator.

With this embodiment the device is a timepiece and the timepiece is driven by the vibration of a piezoelectric actuator in with the present invention as described previously. Thus, the same effects can be obtained as are obtained with the previously described piezoelectric actuator and the vibration components of each vibration mode can be controlled appropriately so as to improve the reliability of the drive performance of the timepiece. This invention is particularly useful in, for example, a wristwatch or other small-sized timepiece having a lens because the piezoelectric actuator can provide a comparatively large drive force while having a small dimensional size.

EFFECTS OF THE INVENTION

In a piezoelectric actuator and device in accordance with the present invention, the detection electrode is formed in such a position that the phase differences or detection signal levels resulting from vibration modes other than the main vibration mode being used are smaller than the target phase difference or target signal level, respectively. As a result; chiefly the vibrational behavior of the main vibration mode can be detected and a single drive signal is determined with respect to an appropriate phase difference or detection signal level. Thus, since the control means can control the drive signal in an appropriate and reliable manner, the reliability of the drive performance can be improved.

DESCRIPTIONS OF THE REFERENCE SYMBOLS

1 . . . drive apparatus (drive unit); 9 . . . timepiece (device); 10 . . . lens unit 30, 40, 50 . . . lens (driven body); 66, 76 . . . vibrating body (piezoelectric actuator); 82, 111A, 111B . . . piezoelectric element; 82A, 82B, 101B, 102A, 103A, 112A, 113A, 114A, 112B, 113B, 114B . . . drive electrode; 82C, 101A, 101C, 101D, 101E, 101F, 102B, 115A, 912B . . . detection electrode; 84 . . . voltage applying apparatus (control means); 91, 100A, 100B, 100C, 100D, 100E, 100F, 110A, 110B . . . Piezoelectric actuator; 92 . . . rotor (driven body)

PREFERRED EMBODIMENTS OF THE INVENTION

Embodiments of the present invention will now be described with reference to the drawings. It will be apparent to those skilled in the art from this disclosure that the following descriptions of the embodiments of the present invention are provided for illustration only and not for the purpose of limiting the invention as defined by the appended claims and their equivalents.

In the subsequent description of the second embodiment, parts that are identical to the parts of the first embodiment are indicated with the same reference symbols and descriptions thereof are simplified or omitted for the sake of brevity.

First Embodiment

A lens unit in accordance with a first embodiment of the present invention will now be described. The lens unit 10 is installed in or manufactured as an integral part of a camera that serves as a device.

In addition to the lens unit 10, the camera is also provided with recording medium for recording an image obtained with lenses 30, 40, 50 that make up the lens unit 10, a drive apparatus (drive unit) 1 configured to drive the lenses 30, 40, 50, and a case that houses all of these components. The camera, recording medium, and case are omitted from the drawings.

Figure 1:
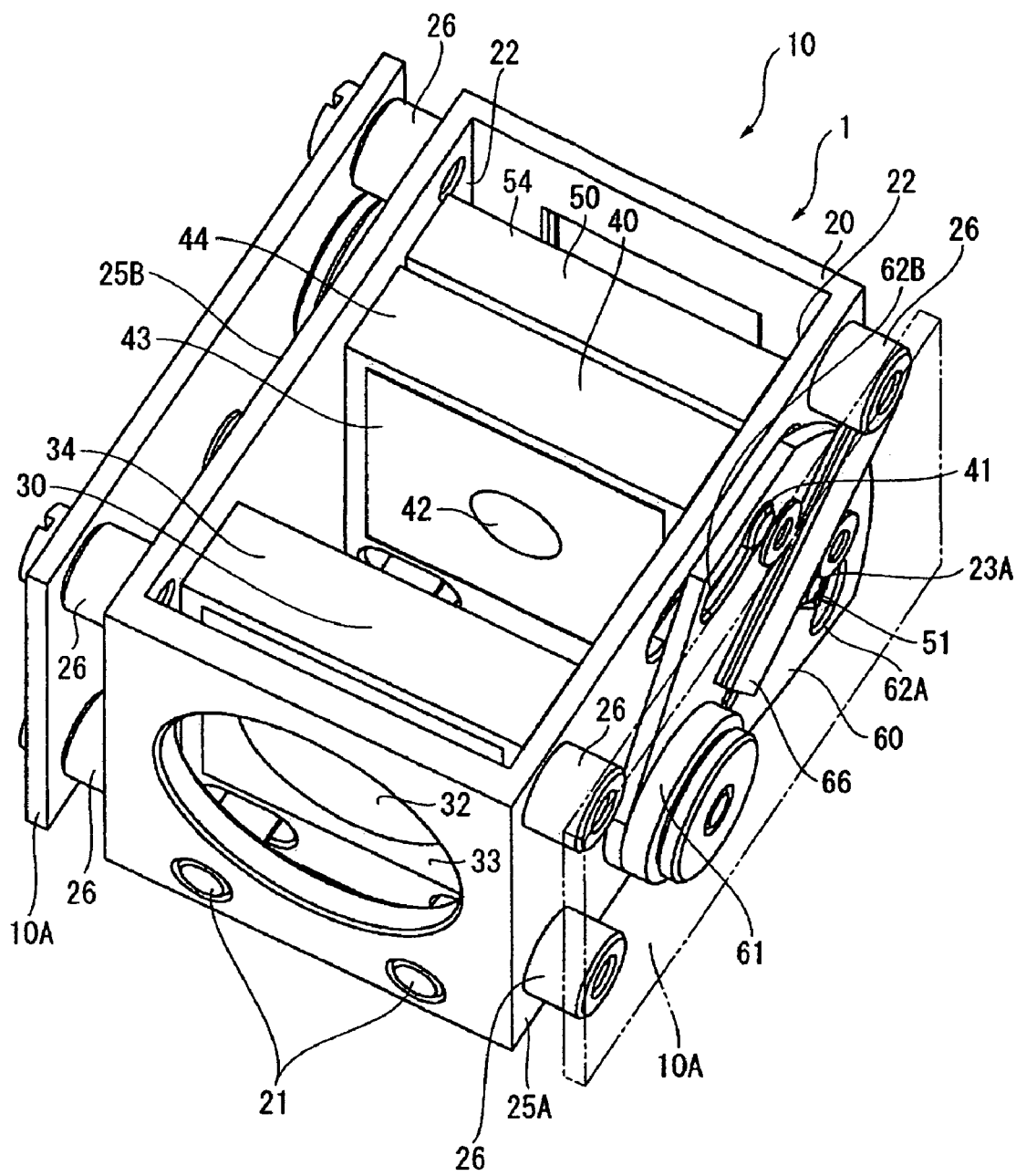
FIG. 1 is a perspective view of a lens unit in accordance with a first embodiment of the present invention
Figure 2:
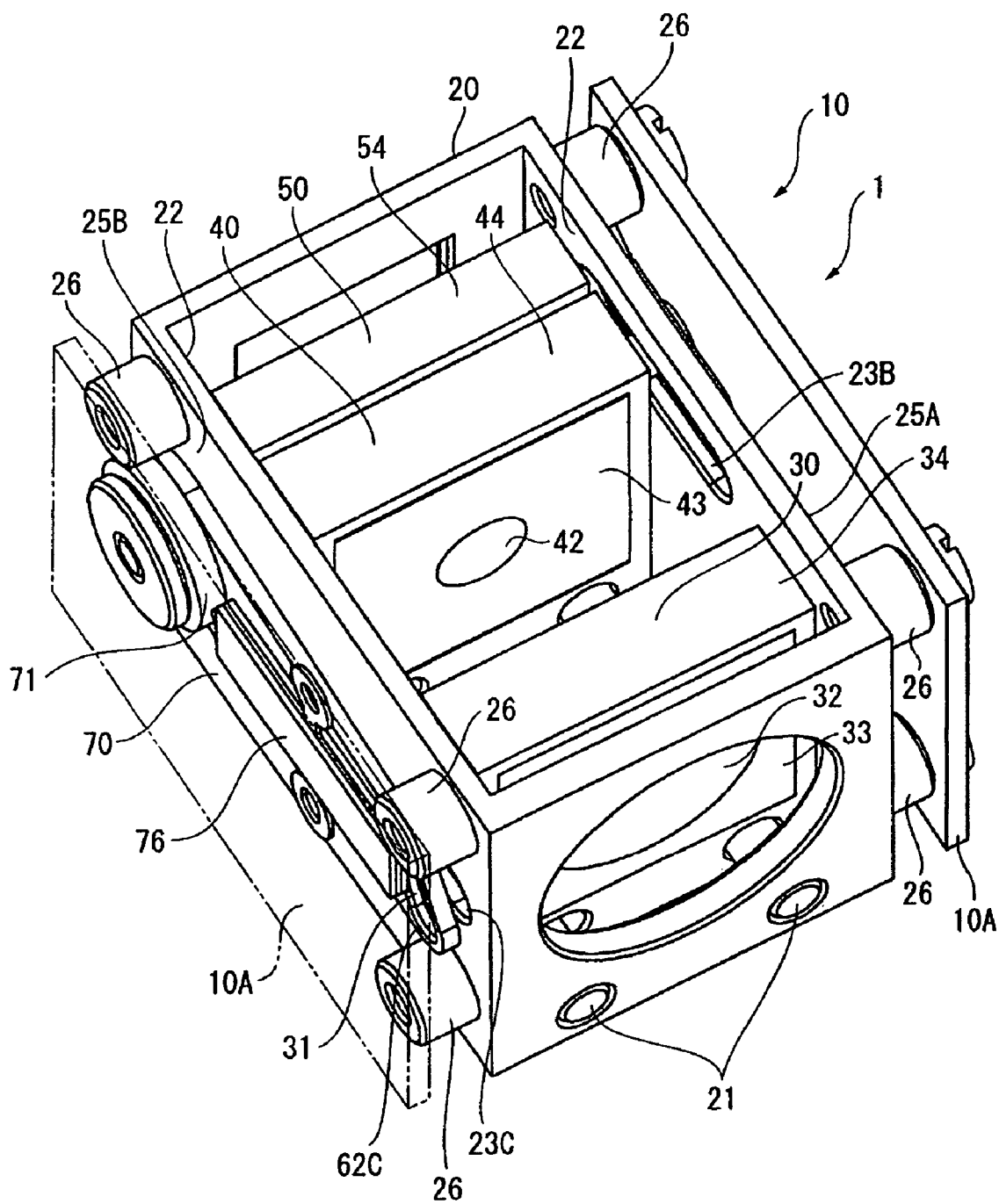
FIG. 2 is a perspective view of the lens unit in accordance with the first embodiment.
Figure 3A:
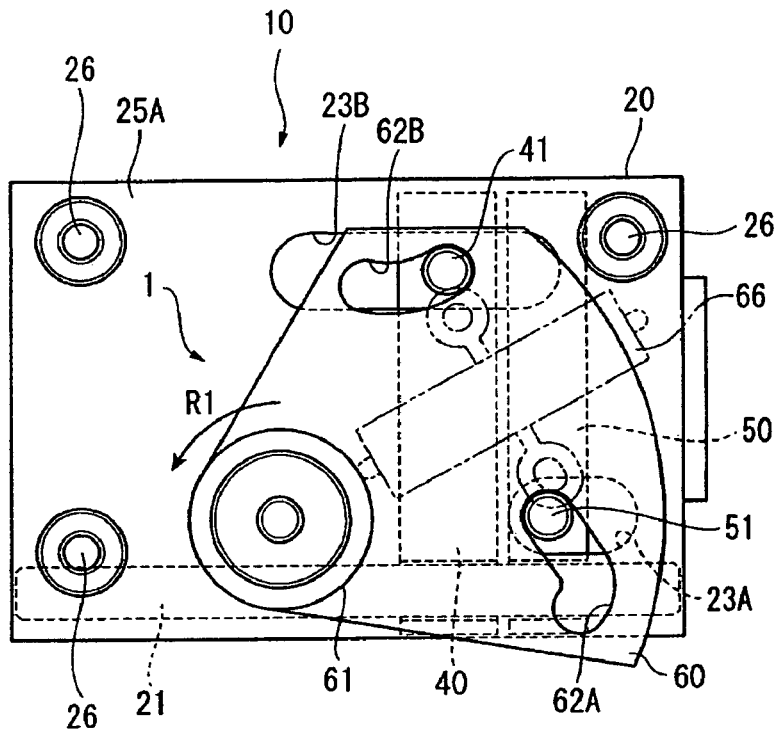
FIG. 3A is a diagram showing the operation of a cam member in accordance with the first embodiment.
Figure 3B:
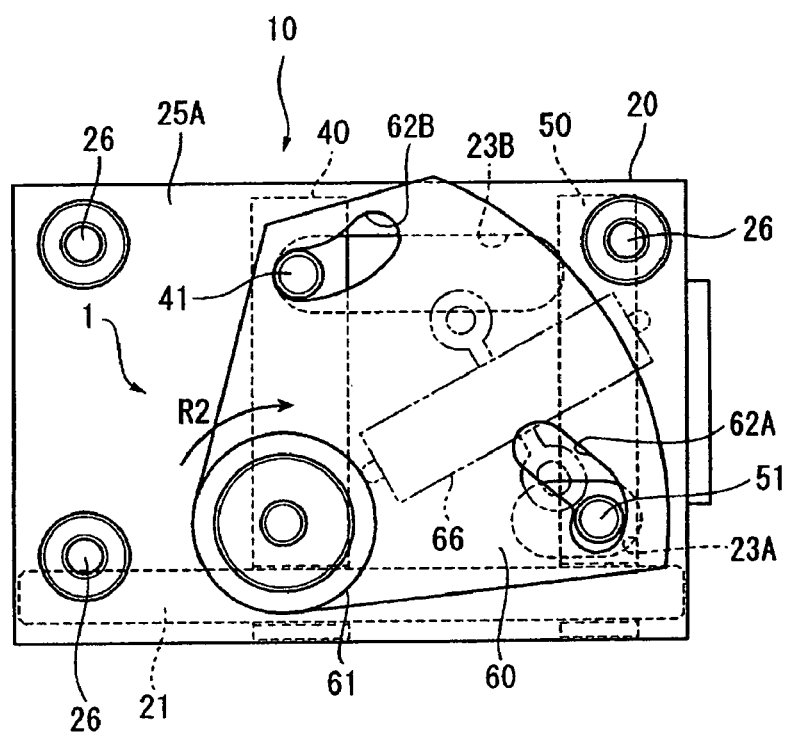
FIG. 3B is a diagram showing the operation of the same cam member in accordance with the first embodiment.
Figure 4A:
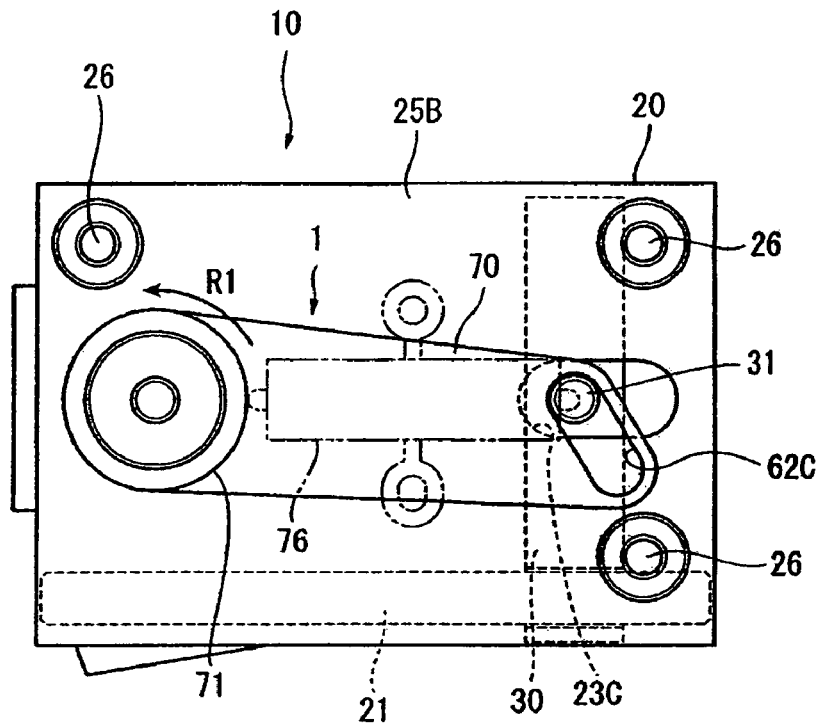
FIG. 4A is a diagram showing the operation of a cam member in accordance with the first embodiment.
Figure 4B:
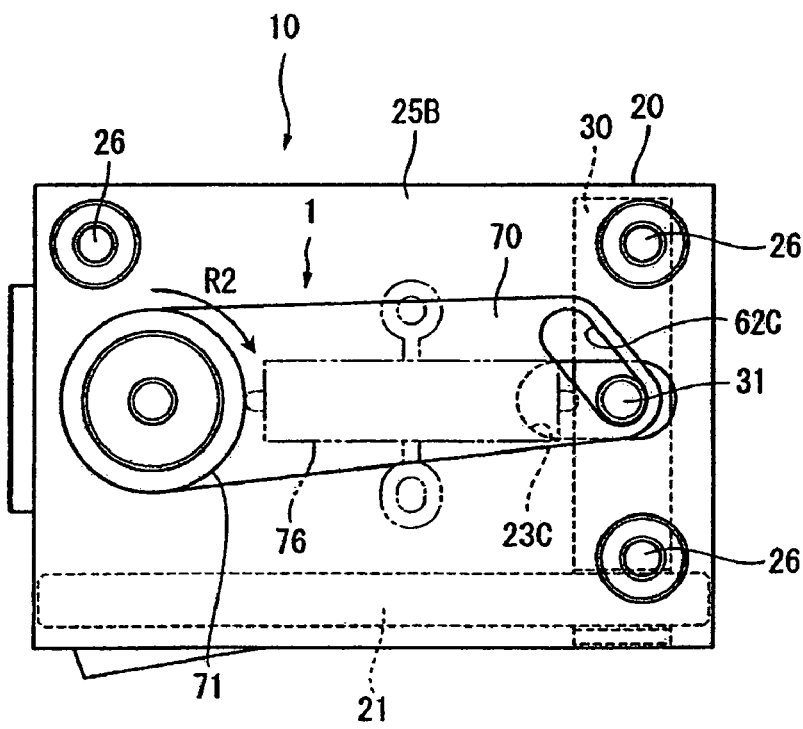
FIG. 4B is a diagram showing the operation of the same cam member in accordance with the first embodiment.
Figure 5:
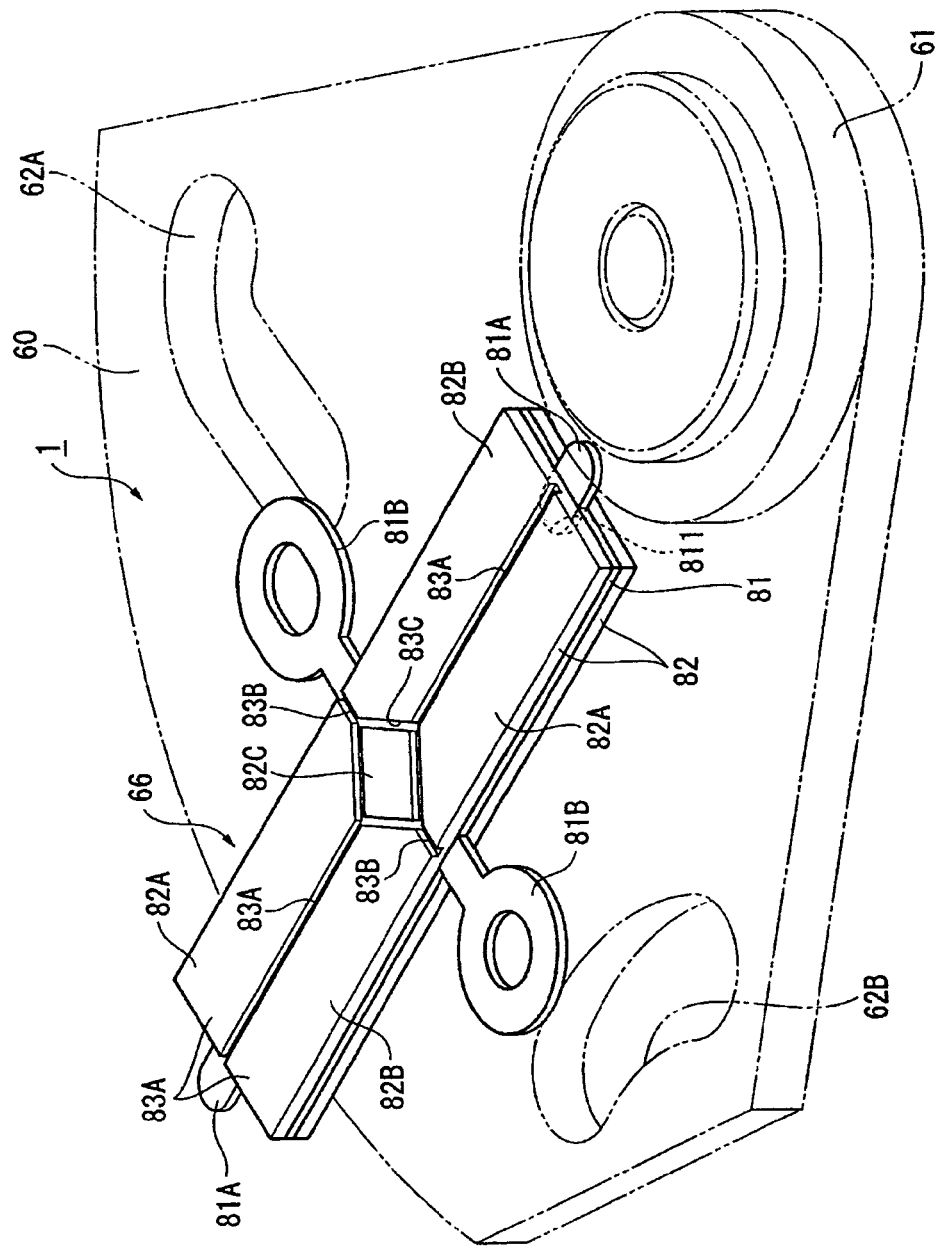
FIG. 5 is an enlarged perspective view of a piezoelectric actuator in accordance with the first embodiment.

FIG. 1 is a perspective view of the lens unit 10 viewed from the upper right and FIG. 2 is a perspective view of the lens unit 10 viewed from the upper left FIGS. 3A and 3B illustrate the operation of a cam member 60 and FIGS. 4A and 4B illustrate the operation of a cam member 70. FIG. 5 is an enlarged perspective view of a vibrating body 66 that serves to drive the cam member 60.

As shown in FIGS. 1 to 5, the lens unit 10 is provided with the following: a generally rectangular tube-shaped enclosure 20; a first lens 30, a second lens 40, and a third lens 50; a cam member 60 configured and arranged to advance and retract the second lens 40 and the third lens 50; a cam member 70 configured and arranged to advance and retract the first lens 30; a vibrating body 66 serving as a piezoelectric actuator (piezoelectric drive apparatus) configured and arranged to rotationally drive the cam member 60; and a vibration body 76 serving as a piezoelectric actuator (piezoelectric drive apparatus) configured and arranged to rotationally drive the cam member 70. The cam members 60, 70 and vibrating bodies 66, 76 constitute a drive apparatus 1 for driving the lenses 30, 40, 50. The component parts will now be described in detail.

The enclosure 20 is installed with two parallel rod-like guide shafts 21 arranged to run from the front face to the rear face of the enclosure 20. The guide shafts 21 serve to guide the lenses 30, 40, 50 when the lenses 30, 40, 50 are advanced and retracted and are arranged to pass through the lenses 30, 40, 50 in the advancement/retraction direction (light axis direction). The guides shaft 21 also serve to prevent the lenses 30, 40, 50 from falling over in the forward or reward direction.

Elongated hole-shaped openings 23A, 23B, 23C are provided in both sides 22 of the enclosure 20. The openings 23A, 23B, 23C are formed to sizes that allow cam rods 31, 41, 51 provided on the lenses 30, 40, 50 move sufficiently.

The first lens 30 is arranged inside the enclosure 20 and provided with a cam rod 31 that is positioned inside the openings 23C of the enclosure 20. The second lens 40 is arranged inside the enclosure 20 and provided with a cam rod 41 that is positioned inside the openings 23B of the enclosure 20. The first lens 50 is and inside the enclosure 20 and provided with a cam rod 51 that is positioned inside the openings 23CA of the enclosure 20.

The first to third lenses 30, 40, 50 each comprise a light collector 32, 42 (Light collector of third lens 50 not shown) arranged in the middle and a frame mounting part 33, 43 (frame mounting part of third lens 50 not shown) arranged around the perimeter of the light collector 32, 42, the light collector 32, 42 and frame mounting part 33, 43 being formed integrally out of the lens material. A holding frame 34, 44, 54 is provided to hold the light collector 32, 42 and frame mounting part 33, 43. Each holding frame 34, 44, 54 is provided with one of the aforementioned cam rods 31, 41, 51.

The first lens 30 is a focusing lens and the second and third lenses 40, 50 are zoom lenses. The third lens 50 is not limited to a zoom lens; it is acceptable for the third lens 50 to be a focusing lens. In such a case, the lens unit 10 can be used as a focusing lens unit by constructing the lenses 30, 40, 50 and setting the optical characteristics of the lenses 30, 40, 50 in the appropriate manner.

The second lens 40 is constructed as a combination of a concave lens and a convex lens, but the structure and constituent features of each lens 30, 40, 50 can be determined as appropriate depending on the purpose of the lens unit.

Also, although in this embodiment the light collectors 32, 42 and the light collector of the third lens 50 are formed as integral units with the frame mounting parts 33, 43 and the frame mounting part of the third lens 50, respectively, using the lens material, it is also acceptable to make only the light collectors 32, 42 and the light collector of the third lens 50 out of the lens material and make the frame mounting parts 33, 43 and the frame mounting part of the third lens 50 as integral units with the holding frames 34, 44, 54 using a different material. It is also acceptable to make the light collectors 32, 42 and light collector of the third lens 50, the frame mounting parts 33, 43 and frame mounting part of the third lens 50, and the holding frames 34, 44, 54 as single integral units, respectively, using the lens material.

The cam members 60, 70 are installed between the outside surfaces 25A, 25B of both sides of the enclosure 20 and cover members 10A that are secured to three leg parts 26 arranged on the outside surfaces 25A, 25B, respectively.

The cam member 60 has a generally fan-shaped form provided with a rotational shaft 61 and is supported on the outside surface 25A of the enclosure 20 in such a manner that it can turn freely about the center axis of the rotational shaft 61. Two cam grooves 62A, 62B are formed in the planar portion of the cam member 60 to serve as drive-purpose guides. The cam grooves 62A, 62B are shaped substantially like circular arcs. The cam rod 41 of the second lens 40 engage with the cam groove 62B and the cam rod 51 of the third lens engages with the cam groove 62A. As result, when the cam member 60 is turned, the cam rods 51, 41 are guided along the cam grooves 62A, 62B and the third lens 50 and second lens 40 are moved forward or rearward with a speed and movement range corresponding to the shapes of the cam grooves 62A, 62B.

The cam member 70 has a generally fan-shaped form provided with a rotational shaft 71 and is supported on the outside surface 25B of the enclosure 20 in such a manner that it can turn freely about the center axis of the rotational shaft 71. A cam groove 62C is formed in the planar portion of the cam member 70 to serve as a drive-purpose guide. The cam groove 62C is shaped substantially like a circular arc and the cam rod 31 of the first lens 30 engages with the cam groove 62C. As a result, when the cam member 70 is turned, the cam rod 31 is guided along the cam groove 62C and the first lens 30 is moved forward or rearward with a speed and movement range corresponding to the shape of the cam groove 62C.

A vibrating body 66, 76 is arranged to abut against the external circumferential surface of the rotational shaft 61, 71 of each cam members 60, 70 and to vibrate in a plane that is substantially perpendicular to the rotational shaft 61, 71. There are no particular limitations on the abutting direction of the vibrating body 66, 76 with respect to the rotational axis 61, 71; any direction is acceptable so long as the rotational shaft 61, 71 can be rotated.

It is also acceptable to employ an alternative arrangement in which an opening is provided in the planar portion of the cam member 60, 70 and the vibrating body 66, 76 is arranged inside the opening such that it abuts against the external circumferential surface of the rotational shaft 61, 71. In such an arrangement, the opening is sized such that the vibrating body 66, 76 does not contact the cam member 60, 70 when the cam member 60, 70 rotates. In this alternative arrangement, the vibrating body 66, 76 can be supported either on the respective outside surface 25A, 25B of the enclosure 20 or on the cover member 10A.

The abutting portions of the vibrating bodies 66, 76 are finished smooth to prevent wear of the external surfaces of the rotational shafts 61, 71. The larger the external diameters of the abutting portions of the vibrating bodies 66, 76 are the better the rotational angle per vibrational cycle is smaller and the lenses 30, 40, 50 can be driven more precisely. It is acceptable for the external shapes of the rotational shafts 61, 71 to be circular only at the portions where the vibrating bodies 66, 76 abut there-against and to have a non-circular shape at the other portions.

As shown in FIG. 5, the vibrating body 66 comprises a reinforcing plate 81 having the form of a generally rectangular flat plate and piezoelectric elements 82 each having the form of a generally rectangular flat plate and arranged on front and back sides of the reinforcing plate 81.

The reinforcing plate 81 has a recessed part 811 formed in each of the two shorter sides thereof and a generally elliptical protruding member 81A is arranged in each recessed part 811. The protruding members 81A are made of ceramic or other material having a high rigidity. Approximate one half of each protruding member 81A is arranged inside the respective recessed part 811 of the reinforcing plate 81 and the remaining half protrudes from the short side of the reinforcing plate 81. The tip of one of the protruding members 81A is abutted against the external circumferential surface of the rotational shaft 61.

Arm parts 81B that protrude outward in both widthwise directions are provided at the approximate lengthwise middle of the reinforcing plate 81 and formed as an integral part of the reinforcing plate 81. The arm parts 81B protrude at substantially right angles with respect to the reinforcing plate 81 and the tips thereof are fastened to the cover member 10A with small screws (not shown). The reinforcing plate 81 is made of stainless steel or other material.

The piezoelectric elements 82 are bonded to substantially rectangular portions of both sides of the reinforcing plate 81 and made of any of the following materials, selected as appropriate: lead zirconate tinate (PZT), crystal, lithium niobate, barium titanate, lead titanate, lead meta-niobate, polyvinylidene fluoride, lead zinc niobate, and lead scandium niobate.

A plurality of electrodes are provided on both sides of the piezoelectric elements 82 by forming a nickel plating layers and gold plating layers. The electrodes are electrically insulated from each other by a groove and arranged so as to be linearly symmetrical with respect a lengthwise centerline. More specifically, a groove 83A oriented in the lengthwise direction of the vibrating body 66 is formed at the widthwise middle of the piezoelectric element 82 and a groove 83B oriented in the widthwise direction of the vibrating body 66 is formed at the lengthwise middle of the piezoelectric element 82. Grooves 82C are formed at the approximate center of the piezoelectric element 82 such that the corners of a substantially rectangular portion are arranged over the grooves 83A, 83B. The grooves 83A, 83B, 83C form a total of five electrodes on the surface of the piezoelectric element 82: two pairs of drive electrodes 82A, 82B—the electrodes of each pair being arranged diagonally opposite of each other—for vibrating the vibrating body 66 and driving the rotational shaft 61 and a detection electrode 82C formed as a generally rectangular (or diamond-shaped) portion at the center of the piezoelectric element 82 and serving to detect the vibrational behavior of the vibrating body 66.

In this embodiment, the piezoelectric element 82 has a generally rectangular shape, the short sides of which are approximately 1 mm long and the long sides of which are approximately 3.5 mm long. The electrodes 82A, 82B, 82C are configured such that the surface area of the detection electrode 82C is between $1/30$ and $1/7$ of the surface area of each pair of drive electrodes 82A, 82B (i.e., between $1/30$ and $1/7$ of the total surface area of the pair of drive electrodes 82A or the total surface area of the pair of drive electrodes 82B) and preferably between $1/15$ and $1/10$ of the surface area of each pair of drive electrodes 82A, 82B. While it is useful for the surface area of the detection electrode 82C to be small because strain resulting from vibration modes other than the main vibration mode one wishes to use can be eliminated, it is difficult to obtain a good detection signal if the surface area of the detection electrode 82C is smaller than $1/30$ of the surface area of the drive electrodes 82A or the drive electrodes 82B because the drive signal itself will become small. Conversely, while the detection signal itself becomes larger when the surface area of the detection electrode 82C is increased, the strain components of vibrations resulting from vibration modes other than the main vibration mode will become large and, therefore, be detected if the surface area of the detection electrode 82C is larger than $1/7$ of the surface area of the drive electrodes 82A or the drive electrodes 82B. If these other vibrations are detected, the desired detection signal will not be obtained.

Although it is difficult to form multiple electrodes on the vibrating body 66 of this embodiment by forming grooves because the vibrating body 66 is very small, drive electrodes 82A, 82I having shapes that enable the vibrating body 66 to be excited in a longitudinal primary vibration mode and a bending secondary vibration mode are obtained with a minimal number of grooves by dividing the piezoelectric element 82 into four sections, excluding the detection electrode 82C.

The pair of drive electrodes 82A and the pair of drive electrodes 82B are each connected together with lead wires (not shown) and the lead wires are connected to a voltage applying apparatus 84 (shown in FIG. 6) that serves as a control means for controlling the vibrational behavior of the vibrating body 66. The detection electrode 82C is connected to the voltage applying apparatus 84 with a lead wire (not shown) and the reinforcing plate 81 is connected to ground with a lead wire (not shown).

The electrodes 82A, 82B, 82C are provided in the same pattern on both of the piezoelectric elements 82 arranged on the front and back of the reinforcing plate 81 such that, for example, the electrode located on the back side of an electrode 82A is also an electrode 82A.

By selectively applying voltages to certain drive electrodes 82A, 82B of a piezoelectric element 82 configured as described above, the vibrating body 66 can be made to vibrate in a longitudinal primary vibration mode or a bending secondary vibration mode, i.e., a longitudinal vibration mode in which the vibrating body 66 elongates and contracts in the lengthwise direction of the vibrating body 66 or a bending vibration mode in which the vibrating body 66 undergoes bending vibration in the widthwise direction (short direction) of the vibrating body 66 (i.e., bends in a direction substantially perpendicular to the vibration direction of the long primary vibration mode). For example, if voltage is applied only to the drive electrodes 82A, the portions of the piezoelectric elements 82 where the drive electrodes 82A are formed will elongate and contract generally within the plane of the vibrating body 66 and vibrate in the longitudinal primary vibration mode. Since a voltage is not applied to the drive electrodes 82B, vibration in the longitudinal primary vibration mode is impeded in the portions where the drive electrodes 82B are formed and the vibrational behavior of the vibrating body 66 as a whole will become unbalanced along the lengthwise centerline. Consequently, the vibrating body 66 will vibrate in a bending secondary vibration mode in which it bends in a direction substantially perpendicular to the lengthwise direction of the vibrating body 66. As a result, the protruding member 81A of the vibrating body 66 vibrates along a generally elliptical path resulting from the combination of vibration in the longitudinal primary vibration mode and vibration in the bending secondary vibration mode. Along a portion of the generally elliptical path, the protruding member 81A rotates the rotational shaft 61 in a tangential direction.

Therefore, the detection electrode 82C is formed so as to be centered on a position where the strain resulting from vibration in the longitudinal primary vibration mode is maximal and the strain resulting from vibration in the bending secondary vibration mode is the smallest; said position corresponds to a vibrational node of the longitudinal primary vibration mode and a vibrational node of the bending secondary vibration mode.

The rotational direction of the rotational shaft 61 can be switched between a forward direction and a reverse direction by appropriately changing the electrodes of the piezoelectric elements 82 to which the voltage is applied when vibrating the vibrating body 66.

For example, if the rotational direction obtained when the voltage is applied to the drive electrodes 82A is assumed to be the forward direction, then the rotational shaft 61 can be rotated in the reverse direction by applying the voltage to the electrodes 82B and thereby reversing the direction of the vibration in the bending secondary vibration mode. The drive frequency of the drive voltage (drive signal) applied to the piezoelectric elements 82 is set such that when the vibrating body 66 vibrates, a resonance point of vibration in the bending secondary vibration mode appears in the vicinity of a resonance point of vibration in the longitudinal primary vibration mode and the protruding member 81A follows a good generally elliptical path.

Strain occurs in the piezoelectric elements 82 at the portion where the detection electrodes 82C are formed when the vibrating body 66 vibrates and this strain enables a detection signal corresponding to the vibration of the vibrating body 66 to be obtained from the detection electrodes 82C.

The dimensional size, thickness, material, length-to-width ratio, electrode division pattern, etc., of the piezoelectric elements 82 are determined as appropriate in order to make the protruding member 81A readily follow a good generally elliptical path when a voltage is applied to the piezoelectric elements 82.

There are no particular limitations on the waveform of the AC voltage applied to the vibrating body 66; such waveforms as sine waves, square waves, and trapezoidal waves can be used.

The vibrating body 76 has substantially the same constituent features as the vibrating body 66 and an explanation of the vibrating body 76 is omitted here because it can be understood by reading the explanation of the vibrating body 66.

Figure 6:
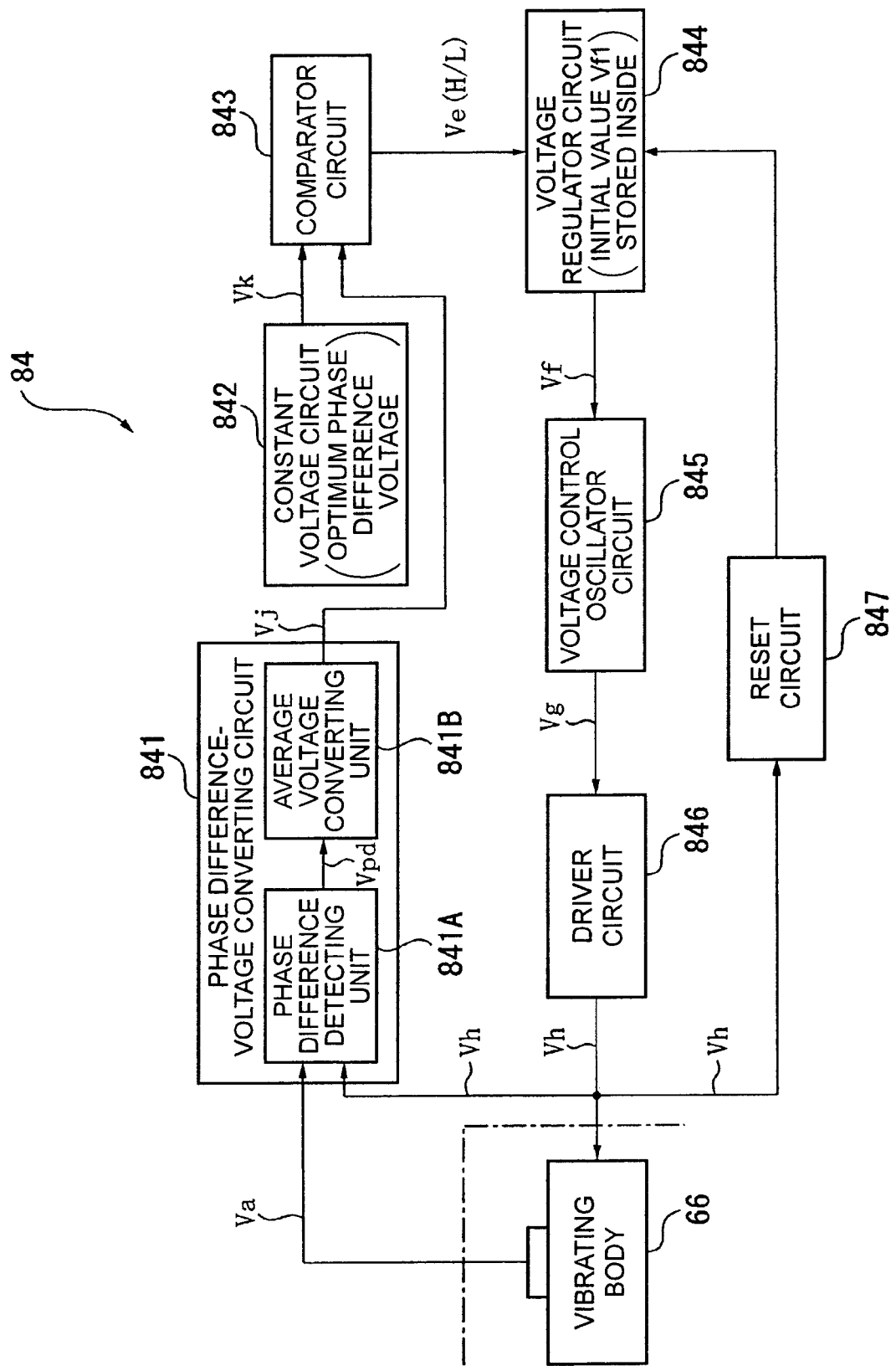
FIG. 6 is block diagram of a voltage applying apparatus in accordance with the first embodiment.

FIG. 6 is a block diagram showing the components of the voltage applying apparatus 84. As shown in FIG. 6, the voltage applying apparatus 84 comprises a phase difference—voltage converting circuit 841, a constant voltage circuit 842, a comparator circuit 843, a voltage regulator circuit 844, a voltage control oscillator circuit 845, a driver circuit 846, and a reset circuit 847.

The phase difference—voltage converting circuit 841 detects the phase difference between the phase of the detection signal Va detected at the detection electrode 82C and the phase of the drive signal Vh applied to the drive electrodes 82A or the drive electrodes 82B, generates a phase difference voltage signal Vj having a voltage value corresponding to the average phase difference, and sends the phase difference voltage signal Vj to the comparator circuit 843.

Figure 7:
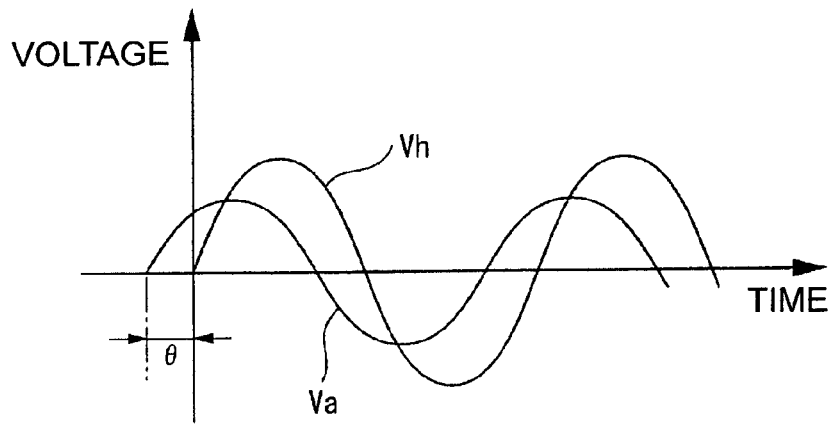
FIG. 7 is a plot showing the phase difference between the drive signal and the detection signal in the first embodiment.

FIG. 7 shows the phase difference θ between the drive signal Vh and the detection signal Va. As shown in FIG. 7, the phase difference θ is detected as a positive (+) value when the detection signal Va is offset from the drive signal Vh in the direction of advancement.

The phase difference—voltage converting circuit 841 includes a phase difference detecting unit 841A and an average voltage converting unit 841B. The phase difference detecting unit 841A receives the detection signal Va and the drive signal Vh, generates a phase difference signal Vpd having a pulse width equivalent to the phase difference between the two signals Va and Vh, and outputs the phase difference signal Vpd to the average voltage converting unit 841B. The average voltage converting unit 841B uses an integration circuit (not shown) to generate a phase difference voltage signal Vj having an average voltage value equivalent to the pulse width of the phase difference signal Vpd and outputs the phase difference voltage signal Vj to the comparator circuit 843.

The constant voltage circuit 842 outputs a pre-calculated prescribed reference phase difference signal Vk to the comparator circuit 843, the reference phase difference signal Vk having a voltage value equivalent to an optimum value (target phase difference) of the phase difference between the phase of the detection signal Va and the phase of the drive signal Vh.

It is preferable for the reference phase difference signal Vk to a phase difference corresponding to a drive frequency at which the vibrating body 66 vibrates in a maximally efficient manner and the ratio of the vibration components of the longitudinal primary vibration mode and the bending secondary vibration mode is appropriate.

Figure 8A:
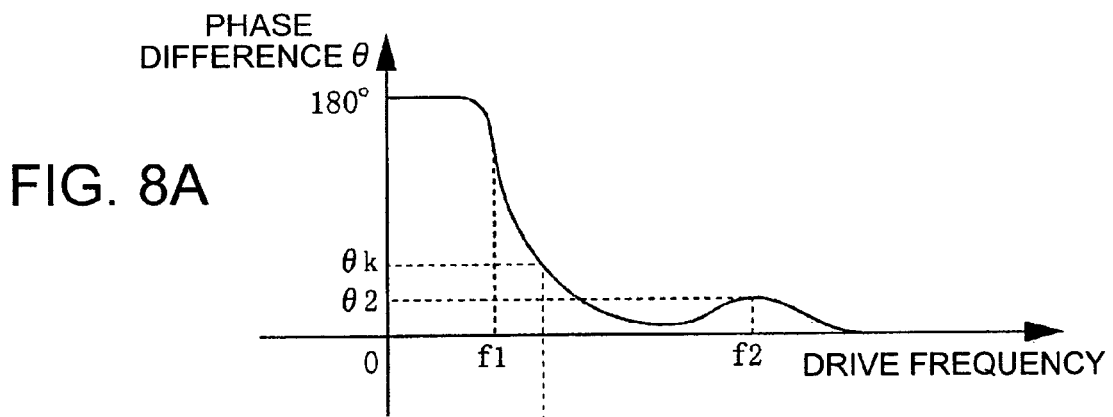
FIGS. 8A and 8B shows plots of the phase difference and drive speed versus the drive frequency in the first embodiment.
Figure 8B:
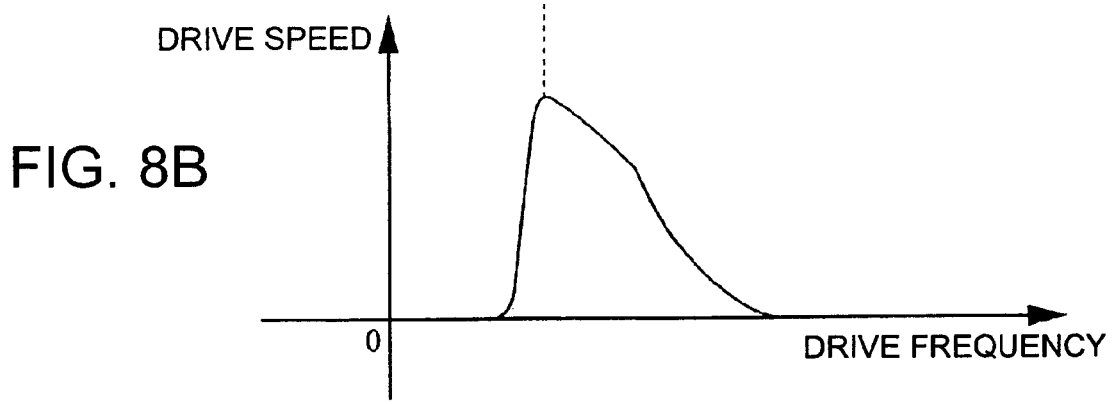

FIG. 8 shows behavior characteristics of the vibrating body 66 with respect to the drive frequency. FIG. 8(A) shows phase difference θ versus the drive frequency and FIG. 8(B) shows the drive speed (rotational speed) of the rotational shaft 61 versus the drive frequency. As shown in FIG. 8(A), as the drive frequency of the vibrating body 66 is varied, the phase difference θ becomes high in the vicinities of both the resonance frequency f1 of vibration in the longitudinal primary vibration mode and the resonance frequency f2 of vibration in the bending secondary vibration mode. Also, as shown in FIG. 8(B), as the drive frequency of the vibrating body 66 is varied, the drive speed of the rotational shaft 61 becomes large in the range of drive frequencies lying between the resonance frequency f1 of vibration in the longitudinal primary vibration mode and the resonance frequency f2 of vibration in the bending secondary vibration mode and reaches a maximum at a drive frequency that is closer to the resonance frequency f1 of vibration in the longitudinal primary vibration mode. This result is clearly due to the fact that it is generally easier to secure drive torque from the vibrating body with vibration in the longitudinal primary vibration mode than with vibration in the bending secondary vibration mode. Therefore, it is preferable to set the drive frequency to a frequency lying between the resonance frequency f1 of vibration in the longitudinal primary vibration mode and the resonance frequency f2 of vibration in the bending secondary vibration mode and closer to the resonance frequency f1 of vibration in the longitudinal primary vibration mode.

Thus, in this embodiment the drive frequency where the drive speed of the rotational shaft 61 becomes is maximum is selected and the reference phase difference signal Vk is set to a value having a voltage value corresponding to the phase difference (target phase difference) θk that occurs at that frequency.

The detection signal is not easily affected by vibration in the bending secondary vibration mode because the detection electrode 82C is formed in such a manner as to include the position where strain resulting from vibration in the bending secondary vibration mode reaches the smallest. Thus, the detection signal detected by the detection electrode 82C is such that the phase difference θ increases in the vicinities of both the resonance frequency f1 of vibration in the longitudinal primary vibration mode and the resonance frequency f2 of vibration in the bending secondary vibration mode but the change in phase difference θ resulting from vibration in the bending secondary vibration mode is smaller than the change in phase difference θ resulting from vibration in the longitudinal primary vibration mode. As can be observed in FIG. 8(A), the phase difference θk is larger than the phase difference θ2 at the resonance frequency f2 of vibration in the bending secondary vibration mode. Consequently, there is always only one drive frequency that corresponds to the phase difference θk.

In other words, since the detection electrode 82C is formed in such a position that the phase differencesθ resulting from vibration modes (bending secondary vibration mode) other than the main vibration mode being used (longitudinal primary vibration mode) are smaller than the target phase difference θk only the phase difference θ resulting from the longitudinal primary vibration mode reaches the target phase difference. Consequently, since a single drive frequency can be determined with respect to the target phase difference θk, the voltage applying apparatus 84 can adjust the drive signal in an optimum manner by controlling the drive signal based on the target phase difference.

The comparator circuit 843 receives the phase difference voltage signal Vj from the phase difference—voltage converting circuit 841 and the reference phase difference signal Vk from the constant voltage circuit 842 and compares the two signals. If the phase difference voltage signal Vj is equal to or larger than the reference phase difference signal Vk, the comparator circuit 843 issues a comparison result signal Ve indicating a result of "H" to the voltage regulator circuit 844. Meanwhile, if the phase difference voltage signal Vj is smaller than the reference phase difference signal Vk, the comparator circuit 843 issues a comparison result signal Ve indicating a result of "L" to the voltage regulator circuit 844.

The voltage regulator circuit 844 receives the comparison result signal Ve from the comparator circuit 843 and adjusts the voltage value of a regulating signal sent to the voltage control oscillator circuit 845 by the amount of a prescribed voltage value Vf0. More specifically, the voltage regulator circuit 844 raises the voltage value of the regulating signal Vf by the prescribed voltage value Vf0 if the comparison result signal indicates the result "H" and lowers the voltage value of the regulating signal Vf by the prescribed voltage value Vf0 if the comparison result signal indicates the result "L." The voltage regulator circuit 844 also stores an initial value Vf1 that serves as the initial regulating signal and outputs a regulating signal Vf having a voltage value set to the initial value Vf1 to the voltage control oscillator circuit 845 when the voltage applying apparatus 84 is started up. The initial value Vf1 is a voltage value corresponding to the upper limit value of a preset adjustment range of the drive frequency. In this embodiment, the adjustment range of the drive frequency is set to be the range of frequencies spanning from a frequency that is lower than the resonance frequency f1 of vibration in the longitudinal primary vibration mode by a prescribed value to a frequency that is higher than the resonance frequency f2 of vibration in the bending secondary vibration mode by a prescribed value. Thus, in this embodiment, the initial value Vf1 is set to a voltage value equivalent to the frequency that is higher than the resonance frequency f2 of vibration in the bending secondary vibration mode by a prescribed value.

The voltage control oscillator circuit 845 receives the regulating signal Vf from the voltage regulator circuit 844 and adjusts the frequency of a reference signal Vg that is outputted to the driver circuit 846. More specifically, the voltage control oscillator circuit 845 raises the frequency of the reference signal Vg by a prescribed value f0 if the voltage value of the regulating signal Vf is higher than the voltage value of the regulating signal Vf of the previous control cycle and lowers the frequency of the reference signal Vg by a prescribed value f0 if the voltage value of the regulating signal Vf is lower than the voltage value of the regulating signal Vf of the previous control cycle. Also, the voltage control oscillator circuit 845 outputs a reference signal Vg having a preset frequency when the voltage applying apparatus 84 is started up and the regulating signal Vf having the initial value Vf1 is received.

The driver circuit 846 receives the reference signal Vg from the voltage control oscillator circuit 845 and outputs a drive signal Vh having a constant voltage value and the frequency of the reference signal Vg to the drive electrodes 82A or the drive electrodes 82B of the vibrating body 66.

The reset circuit 847 serves to generate a reset signal configured to change the frequency of the reference signal Vg to the frequency corresponding to the initial value Vf1 and send the reset signal to the voltage regulator circuit 844 when the frequency of the drive signal Vh from the driver circuit 846 reaches or falls below a prescribed value. The prescribed frequency value at which the reset signal is outputted is set to the lower limit of the adjustment range of the drive frequency, which, in this embodiment, is a frequency that is lower than the resonance frequency f1 of vibration in the longitudinal primary vibration mode by a prescribed value. When it receives the reset signal from the reset circuit 847, the voltage regulator circuit 844 sends a regulating signal Vf having a voltage value equal to the initial value Vf1 to the voltage control oscillator circuit 845. The voltage control oscillator circuit 845 then adjusts the frequency of the reference signal Vg based on the regulating signal Vf.

Thus, when the voltage applying apparatus 84 is first started up, it applies a drive voltage Vh to the vibrating body 66 based on a reference signal Vg whose frequency corresponds to the voltage value (initial value) Vf1. Since the initial value Vf1 is set to the upper limit value of the adjustment range of the drive frequency, in the initial stage the phase difference voltage signal Vj based on the phase difference θ between the drive signal Vh and the detection signal Va is normally smaller than the reference phase difference signal Vk from the constant voltage circuit 842. Thus, the comparator circuit 843 issues a comparison result signal Ve indicating the result "L" and, based on the comparison result signal Ve, the voltage regulator circuit 844 lowers the voltage value of the regulating signal Vf by the prescribed voltage value Vf0, thereby lowering the frequency of the reference signal Vg issued from the voltage control oscillator circuit 845 by the prescribed value f0.

By repeating this kind of control operation, the frequency of the drive signal Vh applied to the vibrating body 66 is decreased until the phase difference voltage signal Vh is equal to or larger than the reference phase difference signal Vk, at which time the frequency of the drive signal Vh is increased. As a result, the phase difference voltage signal Vj corresponding to the phase difference θ between the drive signal Vh and the detection signal Va is controlled so as to remain in the vicinity of the reference phase difference signal Vk.

If the frequency of the drive signal Vh continues to decline for some reason and reaches or falls below the prescribed value of the reset circuit 847, then the regulating signal Vf of the voltage regulator circuit 844 will be reset to the value corresponding to the initial value Vf1 and control of the frequency will be executed again from the upper limit of the adjustment range of the drive frequency.

A voltage applying apparatus (not shown) having the same constituent features is also provided for the vibrating body 76 and the vibration of the vibrating body 76 is controlled in the same manner as the vibration of the vibrating body 66.

The operation of the lens unit 10 will now be explained with reference to FIG. 3.

First, assume the vibrating body 66 touching against the outside circumference of the rotational shaft 61 vibrates and thereby rotates the rotational shaft 61 through a prescribed angle. As a result, the cam member 60, too, turns through the prescribed angle because it is formed integrally with the rotational shaft 61. Thus, the cam grooves 62A, 62B formed in the cam member 60 also rotate and the cam rods 51, 41 engaged with the cam grooves 62A, 62B move within the openings 23A, 23B while being guided by the inside see of the cam grooves 62A, 62B.

For example, if the rotational shaft 61 is rotated in the counterclockwise (R1) direction from the position shown in FIG. 3A, the second lens 40 and the third lens 50 provided with the cam rods 41 and 51, respectively, will move apart from each other such that, as shown in FIG. 3B, the second lens 40 and third lens 50 are separated by a larger distance.

Conversely, if the applied voltage is switched from the drive electrodes 82A to the drive electrodes 82B or vice versa such that the rotational shaft 61 rotates in the clockwise (R2) direction from the position shown in FIG. 3B, the second lens 40 and the third lens 50 will move closer together and return to the state shown in FIG. 3A.

The second lens 40 and third lens 50 thus function as a zoom lens.

Similarly, FIGS. 4A and 4B illustrate a case in which the vibrating body 76 touching against the outside circumference of the rotational shaft 71 vibrates and thereby rotates the rotational shaft 71 through a prescribed angle. As a result, the cam member 70, too, turns through the prescribed angle because it is formed integrally with the rotational shaft 71. Thus, the cam groove 62C formed in the cam member 70 also rotates and the cam rod 31 engaged with the cam groove 62C moves within the opening 23C while being guided by the inside surface of the cam groove 62C.

For example, if the rotational shaft 71 is rotated in the counterclockwise (R1) direction from the position shown in FIG. 4A, the first lens 30 connected to the cam rod 31 will move in an outward direction away from the center of the enclosure 20 to a position close to an end of the enclosure 20 as shown in FIG. 4B.

Conversely, if the rotational shaft 71 is rotated in the clockwise (R2) direction from the position shown in FIG. 4B, the first lens 30 will move toward the center of the enclosure 20 and return to the state shown in FIG. 4A.

As a result, the first lens 30 functions as a focusing lens.

As described above, the first lens 30, second lens 40, and third lens 50 can be driven back and forth as shown in FIGS. 3A, 3B, 4A, and 4B by switching the drive electrodes of the piezoelectric element 82 to which the voltage is applied, i.e., switching between the drive electrodes 82A and the drive electrodes 82B, while applying vibration directly to the rotational shafts 61, 71 of the cam members 60, 70.

The lenses 30, 40, 50 can be stopped at any desired position by reading the positions of the lenses 30, 40, 50 with sensors (not shown) and feeling the detected positions back to a control circuit functioning to control how the lenses are driven.

The first embodiment offers the following effects.

(1) Since the detection electrode 82C is provided in the approximate center of the piezoelectric element 82 and formed in such a manner as to include a position where the strain resulting from vibration in the bending secondary vibration mode is the smallest, i.e., formed in a position that includes a vibrational node of the bending secondary vibration mode, the effect that the vibration in the bending secondary vibration mode has on the detection signal Va can be held to a minimum. Thus, as shown in FIG. 8, the phase difference θ between the drive signal Vh and the detection signal Va can be made small in the vicinity of the resonance frequency f2 of vibration in the bending secondary vibration mode. As a result, the phase difference θk corresponding to the drive frequency at which the drive speed of the rotational shafts 61, 71 is largest (i.e., the target phase difference θk) is larger than the phase difference θ2 at the resonance frequency f2 of vibration in the bending secondary vibration mode and a single drive signal Vh (drive frequency) can be determined with respect to a reference phase difference signal Vk having a voltage value equivalent to the phase difference θk.

Figure 31:
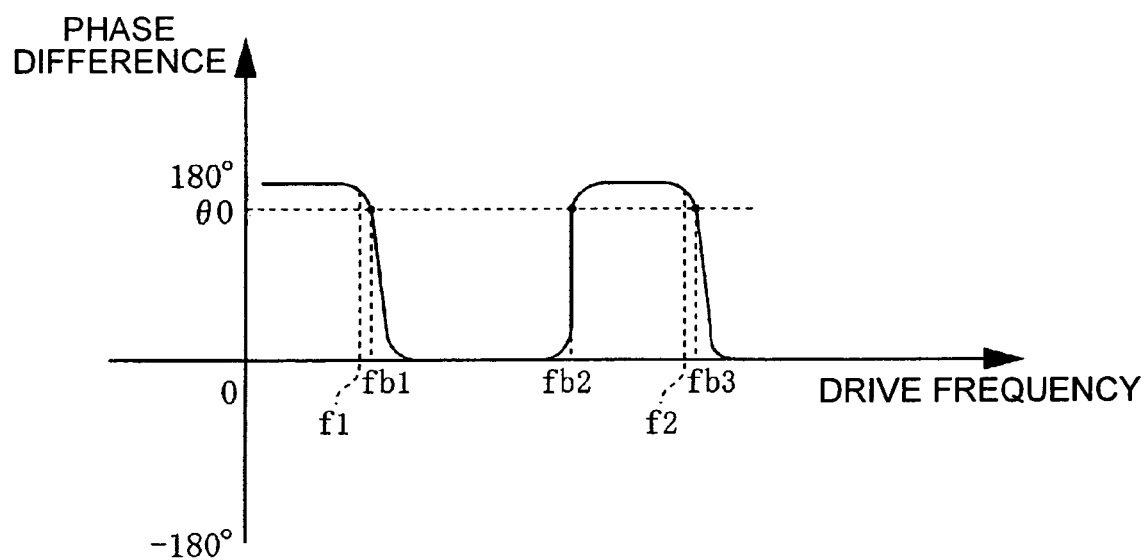
FIG. 31 shows the phase difference versus drive frequency characteristic of a piezoelectric actuator in accordance with a conventional piezoelectric actuator.

Conversely, with the conventional piezoelectric actuator shown in FIG. 31, a single drive frequency cannot be determined with respect to the phase difference and, consequently, the frequency of the drive signal Vh cannot always be controlled in an optimum manner.

The vibration of the vibrating bodies 66 and 76 can be controlled in a reliable manner because the detection electrode 82C is provided in such a position that a single frequency can always be determined for the drive signal Vh. Since an optimum drive speed can always be secured, the drive efficiency of the drive apparatus 1 can be improved.

Also, since the position of the detection electrodes 82C includes a vibrational node of the longitudinal primary vibration mode and the amplitude of the vibration in the longitudinal primary vibration mode is maximal at the position of the node, the vibration in the longitudinal primary vibration mode can be detected easily.

(2) Since the surface area of the detection electrode 82C of each piezoelectric element 82 is 1/30 and 1/7 of the surface area of each pair of drive electrodes 82A, 82B and preferably set to between 1/15 and 1/10 of the same, the vibration can be reliably detected with the detection electrode 82C and the drive electrodes 82A, 82B can be provided with sufficient surface area to secure the drive force required to drive the rotational shafts 61, 71. Since the surface area of the detection electrode is set appropriately, the effect of vibration in the bending secondary vibration mode on the phase difference can be effectively suppressed and a more accurate detection signal can be obtained.

(3) Since the detection electrode 82C of each piezoelectric element 82 is provided in the approximate center of the vibrating body 66, 76 and separately from the drive electrodes 82A, 82B, the vibration of the vibrating bodies 66, 76 can be detected regardless of the vibration direction (vibration direction in the bending secondary vibration mode). If, for example, a drive electrode not being used for driving is used as the detection electrode, the detection electrode will need to be changed when the drive electrodes are switched in order to change the vibration direction Consequently the wiring and control operations will become complex. Conversely, with the detection electrode 82C of the present embodiment, the construction of the voltage applying apparatus 84 can be simplified because the detection electrode 82C is separate from the drive electrodes 82A, 82B.

(4) Since the phase difference θ between the drive signal Vh and the detection signal Va is used as the control target for controlling the drive signal Vh, the variation in the control target is limited to the range of 0 to 180 degrees. More specifically, since the phase difference θ can only be controlled in the range from 0 to 180 degrees regardless of the voltage of the drive signal, the same control circuit (voltage applying apparatus 84) can be used even if the voltage of the drive signal is changed so long as the control circuit is already configured to execute control of the phase difference in that range. Conversely, if the voltage or current of the drive signal is used as the control target for controlling the drive signal Vh, then the voltage value or current value of the detection signal will change when the voltage of the drive signal is changed. Consequently, it will be necessary to prepare a separate control circuit having a different withstand voltage and incorporating other changes in order to accommodate the change in the voltage of the drive signal, thereby making it impossible to use a common control circuit. Thus, with a voltage applying apparatus 84 in accordance with this embodiment, a common circuit can be used to accommodate different drive signal voltage settings in such a manner as to accomplish reliable control of the drive signal Vh without greatly changing the reference phase different signal Vk.

(5) Since the vibrating bodies 66, 76 are formed in the shape of flat plates, the drive apparatus 1 can be provided with a thinner profile and the lens unit 10 can be made more compact. Also, since the protruding member 81A contacts the rotational shaft 61, 71, the rotational angle of the rotational shaft 61, 71 can be maintained due to fiction between the protruding member 81A and the rotational shaft 61, 71 when the vibration of the vibrating body 66, 76 is stopped.

Second Embodiment

Figure 9:
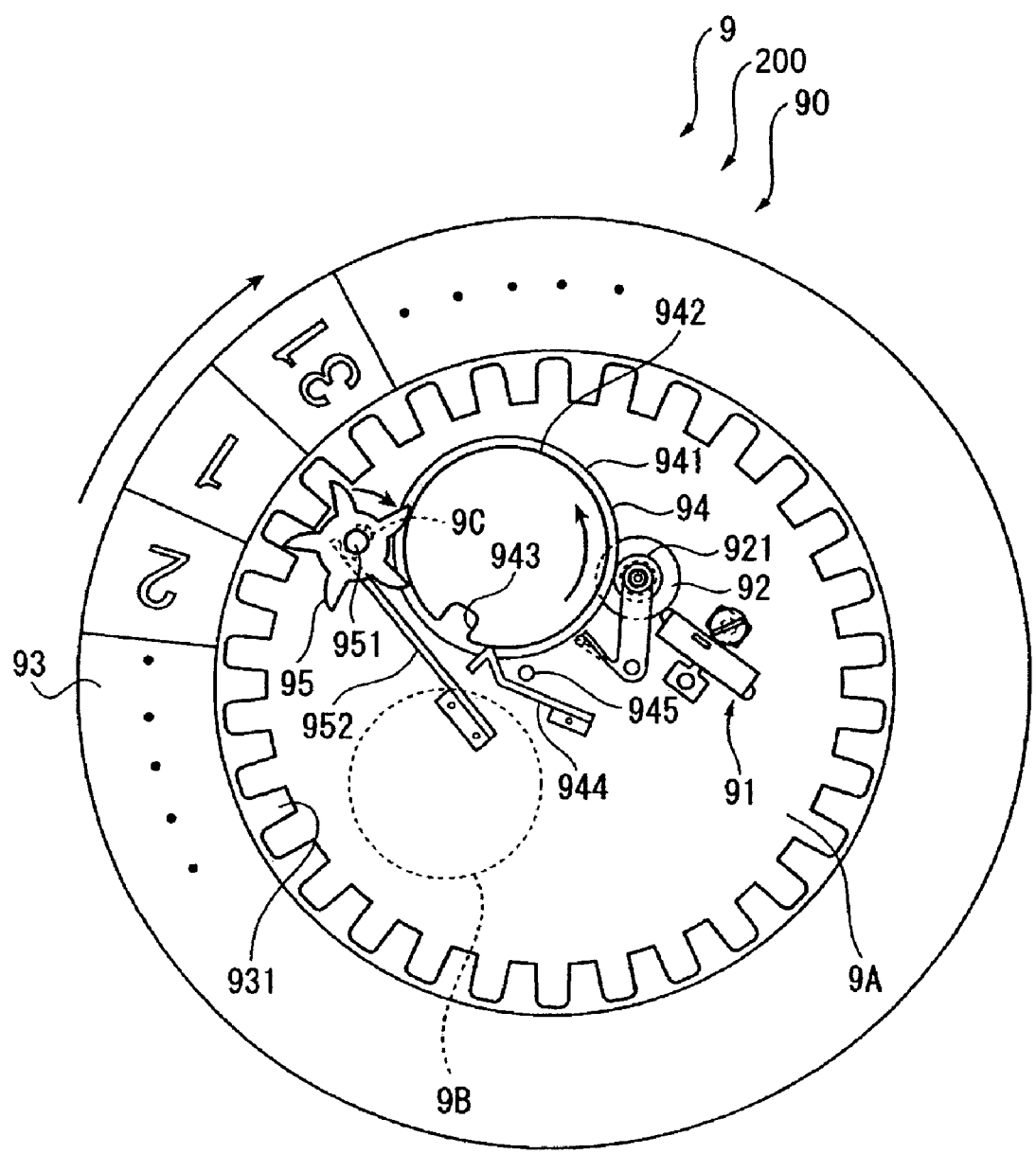
FIG. 9 shows a timepiece in accordance with a second embodiment of the present invention.

A second embodiment of the present invention will now be explained. The second embodiment applies a piezoelectric actuator (piezoelectric drive apparatus) in accordance with the present invention to a timepiece. FIG. 9 is a top plan view of a date indicating mechanism 90 included in a time indicating section 200 of a timepiece 9 in accordance with the second embodiment of the present invention. As shown in FIG. 9, the main components of the date indicating mechanism 90 include a piezoelectric actuator 91, a rotor 92 serving as a driven body rotationally driven by the piezoelectric actuator 91, a reduction gear train configured to transfer the rotation of the rotor while reducing the speed thereof and a date indicator wheel 93 arranged and configured to rotate due to the drive force transferred through the reduction gear train The reduction gear train is provided with date indicator driving intermediate wheel 94 and a date indicator driving wheel 95. The piezoelectric actuator 91, rotor 92, date indicator driving intermediate wheel 94, and date indicator driving wheel 95 are Supported on a bottom plate 9A.

A circular disk-shaped dial (not shown) is provided over the date indicating mechanism 90 and window for indicating the date is provided in a portion of the outer circumference of the dial such that the date of the date indicator wheel 93 can be viewed through the window. Under the bottom plate 9A (on the back side of the bottom plate 9A) are provided a hand moving wheel train (not shown) that is connected to a stepping motor and configured to drive the hands and a secondary battery 9B serving as a power supply. The secondary battery 9B supplies electric power to the stepping motor, the piezoelectric actuator 91, and the circuits of the voltage applying apparatus (not shown). It is also acceptable to adopt an arrangement in which an electric generator configured to generate electricity using solar energy (sunlight) or the rotation of a rotor is connected to the secondary battery 9B and the secondary battery 9B is recharged with electric power generated by the generator. Furthermore, the power supply is not limited to a secondary battery 9B charged with a generator. It is also acceptable to use a general purpose primary battery (e.g., a lithium ion battery).

The date indicator driving intermediate wheel 94 comprises a large diameter part 941 and a small diameter part 942. The small diameter part 942 is cylindrical in shape and slightly smaller in diameter than the large diameter part 941. A generally square shaped cut out part 943 is formed in the outside circumference face of the small diameter part 942. The small diameter part 942 is fastened to the large diameter part 941 in such a manner that the two parts are coaxial with each other. The large diameter part 941 meshes with a toothed wheel 921 on the upper portion of the rotor 92. Thus, the date indicator driving intermediate wheel 94 comprising the large diameter part 941 and the small diameter part 942 rotates in an interlocking manner with the rotation of the rotor 92.

A flat spring 944 is provided on the bottom plate 9A to the side of the date indicator driving intermediate wheel 94; the base end of the flat spring 944 is fixed to the bottom plate 9A and the tip end is bent into a generally V-shaped form. The tip of the flat spring 944 is provided such that it can enter and exit the cut out part 943 of the date indicator driving intermediate wheel 94. A contact 945 is arranged in a position closely adjacent to the flat spring 944 such that when the date indicator driving intermediate wheel 94 rotates and the tip end of the flat spring 944 enters the cut out part 943, the flat spring 944 touches against the contact 945. When the flat spring 944 contacts the contact 945 while a prescribed voltage is being applied to the flat spring 944, the prescribed voltage is also applied to the contact 945. Thus, the date indication state can be detected by detecting the voltage on the contact 945 and one day's worth of rotation of the date indicator wheel 93 can be detected.

The detection of the amount of rotation of the date indicator wheel 93 is not limited to using the flat spring 944 and contact 945. It is also possible to detect the rotational state of the rotor 92 or date indicator driving intermediate wheel 94 and issue a prescribed pulse signal corresponding to the amount rotation of the date indicator wheel 93. For example, a publicly known photoreflector, photointerrupter, or MR sensor or any other type of rotational encoder can be used.

The date indicator wheel 93 has a ring-like shape and an internal gear 931 is formed on the internal face thereof. The date indicator driving wheel 95 is a five-toothed gear wheel that meshes with the internal gear 931 of the date indicator wheel 93. A shaft 951 is provided at the center of the date indicator driving wheel 95 and the shaft 951 passes loosely through a through hole 9C formed in the bottom plate 9A. The through hole 9C is formed to be elongated in the circumferential direction of the date indicator heel 93. The date indicator driving wheel 95 and the shaft 951 are spring loaded in the upper rightward direction of FIG. 9 by the flat spring 952 fixed to the bottom plate 9A The spring action of the flat spring 952 prevents the date indicator wheel 93 from rocking.

Figure 10:
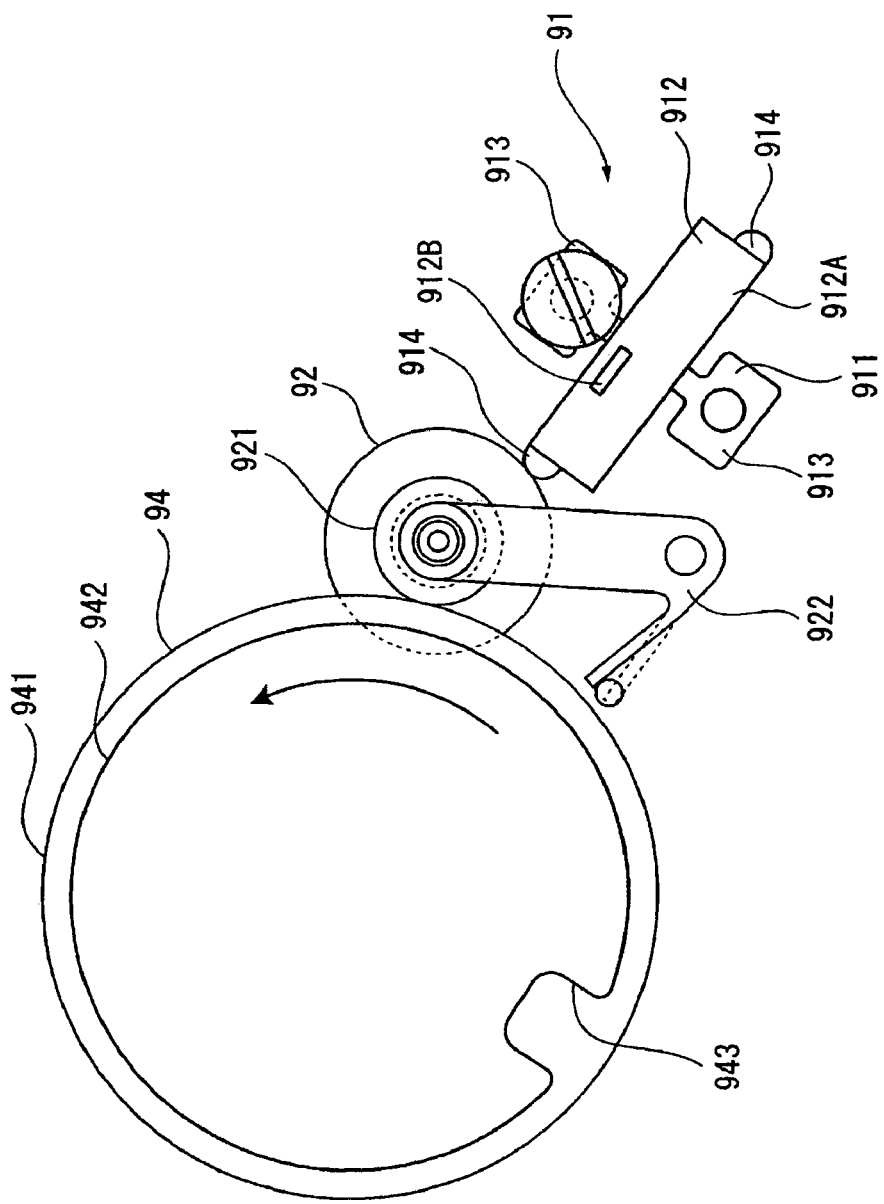
FIG. 10 is an enlarged view of a piezoelectric actuator in accordance with the second embodiment.

FIG. 10 is an enlarged view showing the piezoelectric actuator 91 and the rotor 92. As shown in FIG. 10, the piezoelectric actuator 91 comprises chiefly a reinforcing plate 911 having the form of a generally rectangular flat plate and piezoelectric elements 912 bonded to both sides of the reinforcing plate 911.

Arm parts 913 that protrude outward to both sides are formed at the approximate lengthwise middle of the reinforcing plate 911 and one of the arm parts 913 is fastened to the bottom plate 9A with a small screw. The other arm part 913 is not fastened to the bottom plate 9A and, instead, is left in a free state so as to serve as a weight that balances the vibration when the piezoelectric actuator 91 vibrates.

Substantially semicircular protruding parts 914 that protrude outward in the lengthwise direction of the reinforcing plate 911 are formed on diagonally opposite corners of the reinforcing plate 911. One of the protruding parts 914 abuts against the side face of the rotor 92.

Figure 11:
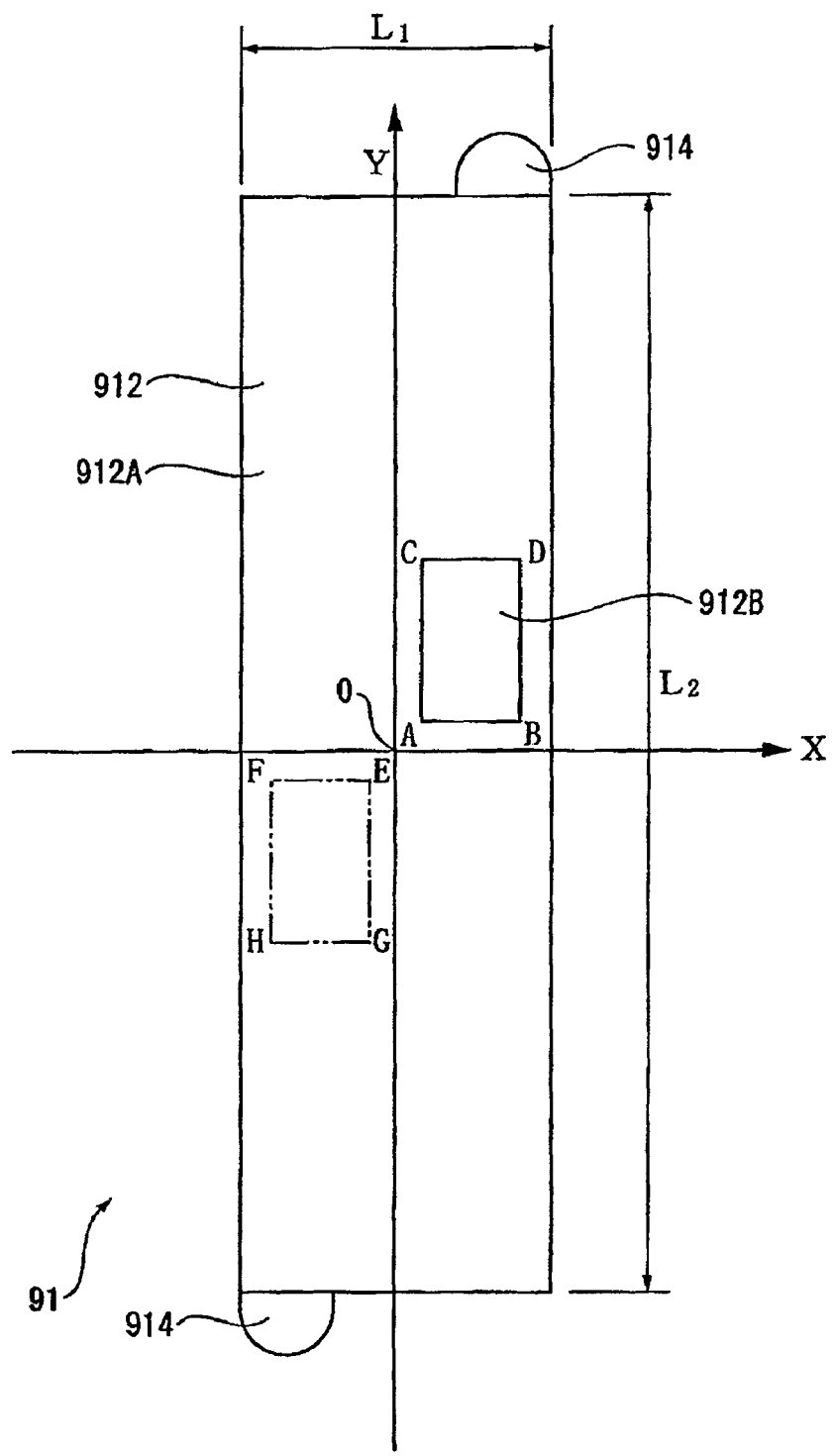
FIG. 11 is a top plan view showing the position of the detection electrode on a piezoelectric element in accordance with the second embodiment.

The piezoelectric elements 912 each have the shape of a generally rectangular plate and are bonded with an adhesive to generally rectangular portions of both sides of the reinforcing plate 911. Electrodes are formed on the surfaces of both piezoelectric elements 912 with plating layers in the same manner as the first embodiment. A generally rectangular detection electrode 912B is formed on the surface of each piezoelectric element 912 by making grooves to electrically insulate the plating layers. As shown in FIG. 11, the detection electrodes 912B are positioned off-center relative to the piezoelectric elements 912. More specially, relative to the center, the detection electrodes 912B are positioned toward the rotor 92 in the lengthwise direction of the piezoelectric elements 912 and toward a protruding part 914 in the widthwise direction of the piezoelectric element 912.

Thus, in this embodiment, an unbalanced state is created by forming the protruding parts 914 on a diagonal (at diagonally opposite corners) of the reinforcing plate 911 and the piezoelectric actuator 91 is excited in the bending secondary vibration mode. When an unbalanced state does not exist, the position where the electric charges resulting from elongation and contraction, respectively, cancel each other out exists on the Y axis (i.e., the lengthwise center axis of the piezoelectric element 912), but that position shifts toward the protruding parts 914 when an unbalanced state exists as in this embodiment. Therefore, in this embodiment, the detection electrode 912B is formed not on the Y axis but in a position shifted in the positive direction of the X axis from the Y axis.

For example, assuming the widthwise dimension (short direction) of a piezoelectric element 912 is L1 and the lengthwise dimension is L2 and an X axis and a Y axis are established on the lengthwise and widthwise center axes, the detection electrode 912B is formed inside an area ABCD located in the positive direction of the X axis (to right of center in figure) and in the positive direction of the Y axis (upward of center in figure) with respect to the intersection point of the X and Y axes. The positions of the points A, B, C, and D are determined based on the dimensions L1 and L2, the weight unbalance of the protruding part 914, etc. For example, the positions might be as follows: A(X, Y)=(0.12L1, 0.02L2), B(X, Y)=(0.45L1, 0.02L2), C(X, Y)=(0.12L1, 0.25L2), D(X, Y)= (0.45L1, 0.25L2).

Since the elongation and contraction motion of the piezoelectric elements 912 is point-symmetrical with respect to the intersection point of the X axis and Y axis, it is also acceptable to provide the detection electrode 912B in the area EGFH indicated with a dotted line in FIG. 11. In short, the position where the detection electrode 912B is formed should be a position where the electric charges resulting from elongation and contraction, respectively, during vibration in the bending secondary vibration mode cancel each other out. For example, the positions might be as follows: E(X, Y)=(−0.12L1, −0.02L2), F(X,Y)=(−0.45L1, −0.02L2), G(X, Y)=(−0.12L1,−0.25L2), D(X, Y)=(−0.45L1, −0.25L2).

The portion of each piezoelectric element 912 other than the detection electrode 912B constitutes a drive electrode 912A. The surface area of the detection electrode 912B is set to be between $\frac{1}{30}$ and $\frac{1}{7}$ of the surface area of the drive electrode 912A, preferably $\frac{1}{15}$ and $\frac{1}{10}$ of the same.

When a voltage having a prescribed frequency is applied to the drive electrodes 912A of the piezoelectric actuator 91, the piezoelectric elements 912 are excited so as to vibrate in a longitudinal print vibration mode in which they elongate and contract in the lengthwise direction. Since the protruding parts 914 are provided at diagonally opposite corners of both ends of the piezoelectric actuator 91, the overall weight distribution of the piezoelectric actuator 91 is unbalanced with respect to the lengthwise center line. Due to the balance, the piezoelectric actuator 91 will vibrate in a bending secondary vibration mode in which it bends in a direction substantially perpendicular to the lengthwise direction. Consequently, the piezoelectric actuator 91 vibrates according to a combination of the longitudinal primary vibration mode and the bending secondary vibration mode and the protruding parts vibrate along a generally elliptical path.

Figure 12:
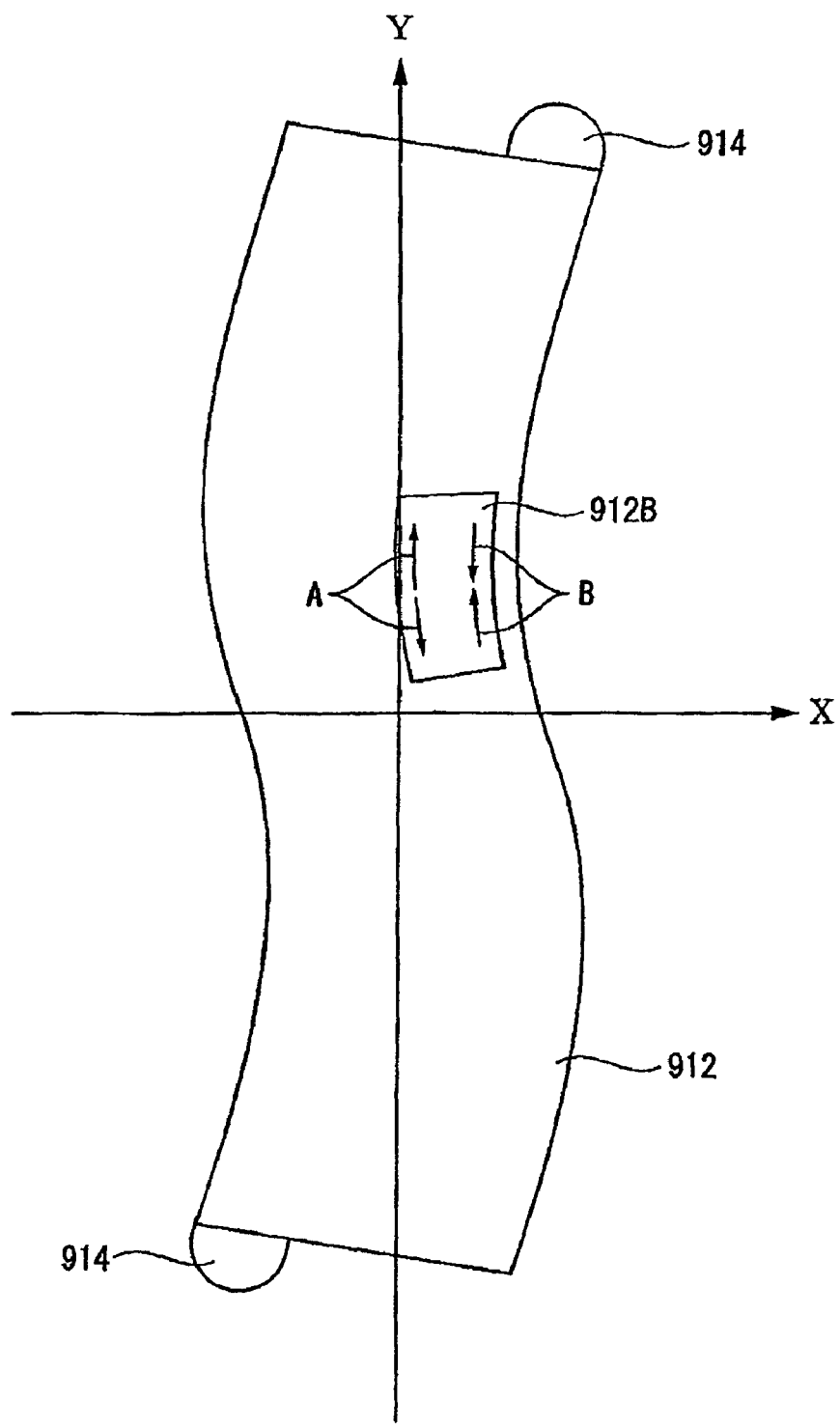
FIG. 12 is a top plan view a vibrating state of a piezoelectric element in accordance with the second embodiment.

As shown in FIG. 12, sections where the electrode elongates (arrows A) and sections where the electrode contracts (arrows B) occur in the detection electrode 912B due to the vibration in the bending secondary vibration mode. The piezoelectric element generates a positive charge when compressed and a negative charge when elongated. By utilizing this characteristic and drawing a detection signal from the detection electrode 912B, a signal that corresponds to the vibration can be obtained due to the electric charges that occur in response to the elongation and contraction of the detection electrode 912B.

More specifically, when a signal is applied to the drive electrodes 912A and the piezoelectric elements 912 are made to elongate and contract, the effect of the longitudinal primary vibration mode is such that at any given point in time, the entire detection electrode 912B is either elongated or contracted due to the longitudinal vibration.

Conversely, the effect of the bending secondary vibration mode is such that at any given point in time, both elongated portions and contracted portions coexist in the detection electrode 912B. Since the positive charges and negative charges occurring in the elongated portions and contracted portions of the detection electrode 912B cancel each other out the detection signal resulting from these charge is small. At the same time, the phase difference between the drive signal and the detection signal in the vicinity of the resonance frequency is also reduced.

Thus, with a detection electrode 912B in which elongated portions and contracted portions caused by the bending secondary vibration mode coexist, the electric charges resulting from the elongation and contraction cancel each other out and the phase difference resulting from the bending secondary vibration mode is substantially zero (e.g., a small value of 20 degrees or smaller).

If the position of the detection electrode 912B is moved in the negative X direction along the X axis, i.e., toward the Y axis, the phase difference resulting from the bending secondary vibration mode will increase. Meanwhile, if the detection electrode 912B is moved in the positive X detection toward the edge of the piezoelectric element 912, the phase difference resulting from the bending secondary vibration mode will become a negative value and the normal detection control scheme based on phase differences from 0 to 180 degrees will have to be changed to a detection control scheme based on phase differences from −180 to +180 degrees, which will cause the control processing mechanism to become complex. Therefore, it is necessary to arrange the detection electrode 912B at an appropriate X-axis position between the Y axis and the edge of the piezoelectric element (e.g., between A and B in FIG. 11). If the position of the detection electrode 912B is moved in the positive Y direction along the Y axis i.e., toward the end part of the piezoelectric element 912 in the lengthwise direction, the phase difference resulting from the bending secondary vibration mode will increase and the detection signal level will decrease. That is, if the detection electrode 912B is moved in the positive Y direction, the strain resulting from the longitudinal primary vibration mode will decrease, the electric charge generated by the stain will decrease, and the detection signal level will decline. In this embodiment, the detection signal obtained from the detection electrode is used for control. If the signal level is low, the signal will be easily affected by electrical noise, mechanical vibrations, and light physical shocks (impacts) and the control will be unstable.

Moreover, the ratio of electric charge generated due to strain resulting from the bending secondary vibration mode will increase. As a result, the detection signal will be greatly affected by bending Vibration and the phase resulting from the bending secondary vibration mode will increase.

Therefore, it is necessary to arrange the detection electrode 912B at an appropriate Y-axis position between the X axis and the lengthwise end part piezoelectric element (e.g., between A and C in FIG. 11).

The drive electrodes 912A, detection electrodes 912B, and reinforcing plate 911 are each connected to a voltage applying apparatus (not shown) with lead wires or the like. Similarly to the voltage applying apparatus 84 of the first embodiment, the voltage applying apparatus executes control of the drive signal such that the phase difference the drive signal and the detection signal is adjusted to an appropriate value.

Figure 13:
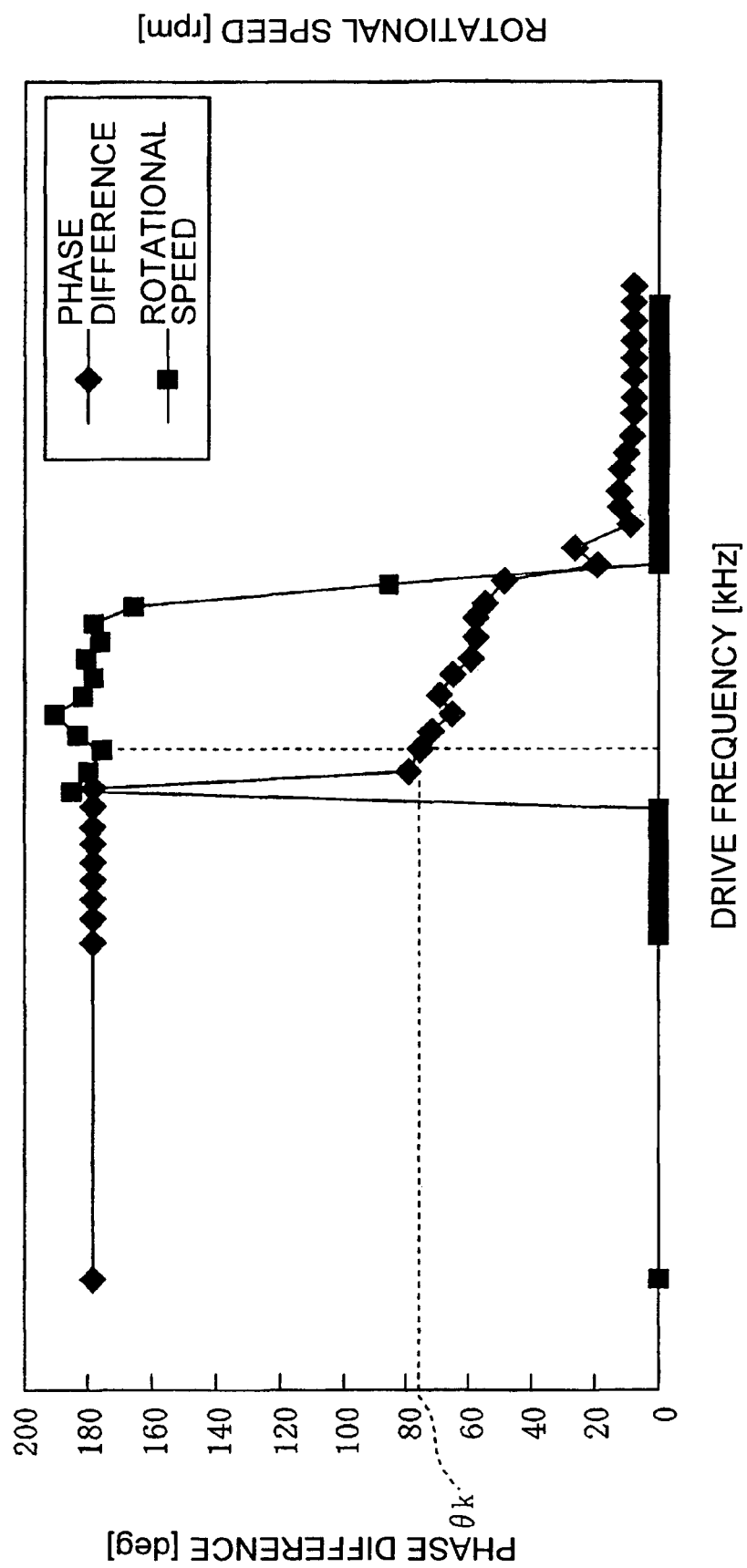
FIG. 13 shows plots of the phase difference and drive speed versus the drive frequency in the second embodiment.

FIG. 13 shows the vibration characteristic of the piezoelectric actuator 91 and the operation characteristic of the date indicating mechanism 90 with respect to the drive frequency applied to the piezoelectric actuator 91 in the case of a date indicating mechanism 90 in accordance with this embodiment. As shown in FIG. 13, in a certain range of drive frequencies, the phase difference gradually decreases as the drive frequency increases. Also, the rotational speed of the rotor 92 is large in the range of drive frequencies where the phase difference decreases. Thus, this range of frequencies lies between the resonance frequency of vibration in the longitudinal primary vibration mode and the resonance frequency of vibration in the bending secondary vibration mode and it can be said that this is a range where adequate vibration occurs in both vibration modes. Therefore, in this embodiment, the reference phase difference signal Vk of the voltage applying apparatus is set to a value having a voltage value equivalent to a phase difference θk (e.g., between 70 and 80 degrees) corresponding to said range of drive frequencies.

A flat spring 922 is mounted to the rotor 92 such that the rotor 92 is spring loaded toward the piezoelectric actuator 91. As a result, an appropriate friction force is generated between the protruding part 914 and the side face of the rotor 92 and the drive force of the piezoelectric actuator 91 can be transferred in an efficient manner.

In this timepiece 9, when a drive signal controlled to a prescribed frequency is applied to the piezoelectric actuator 91 by the voltage applying apparatus in the same manner as in the first embodiment, the piezoelectric actuator 91 is excited so as to vibrate according to a combination of the longitudinal primary vibration mode and the bending secondary vibration mode. The protruding part 914 vibrates along a generally elliptical path resulting from the combination of these vibration modes and pushes against the rotor 92 during a portion of said vibration path, thereby rotationally driving the rotor 92.

The rotational motion of the rotor 92 is transferred to the date indicator driving intermediate wheel 94 and when a tooth of the date indicator driving wheel 95 meshes with the cut out part 943, the date indicator driving wheel 95 is rotated by the date indicator driving intermediate wheel 94, thereby causing the date indicator wheel 93 to be rotated. The rotation of the date indicator wheel 93 changes the indicated date.

Although the constituent features of the second embodiment are different from those of the first embodiment, the second embodiment areas the previously described effects (1), (2), and (4) of the first embodiment The second embodiment also offers the following additional effects.

(6) Since the protruding parts 914 are provided on diagonally opposite corners of the piezoelectric actuator 91, the weight of the piezoelectric actuator 91 is unbalanced in such a manner that it can be vibrated in both ie longitudinal primary vibration mode and the bending secondary vibration mode with only one drive electrode 912A. Consequently, the electrode configuration of the piezoelectric element 912 can be simplified. As a result, the control of the drive signal executed by the voltage applying apparatus can also be simplified. This feature is particularly useful in a case where, for example, the piezoelectric actuator 91 is small in size and it would be difficult to form complexly shaped electrodes on the small piezoelectric element 912 by making grooves.

(7) Since the piezoelectric actuator 91 can be controlled such that the drive efficiency thereof is optimum at all times, when the piezoelectric element 91 is used in the date indicating mechanism 90 of a timepiece 9, the date indicating mechanism 90 can be driven with better reliability and the date can be indicated accurately. Also, since the piezoelectric element 91 can be made smaller, the timepiece 9 can be made more compact.

The present invention is not limited to the embodiments described heretofore; various modifications and improvements can be adopted which achieve the object of the invention without deviating from the scope of the invention.

Although the first embodiment has a diamond-shaped detection electrode 82C formed in the approximate center of each piezoelectric element 82 and the second embodiment has a generally rectangular detection electrode 912B formed in a position of the piezoelectric element 912 that is off-center toward a protruding part 914, the shape and arrangement of the detection electrode are not limited to those of the embodiments. For example, FIGS. 14A to 14F show some alternative shapes and arrangements.

Figure 14A:
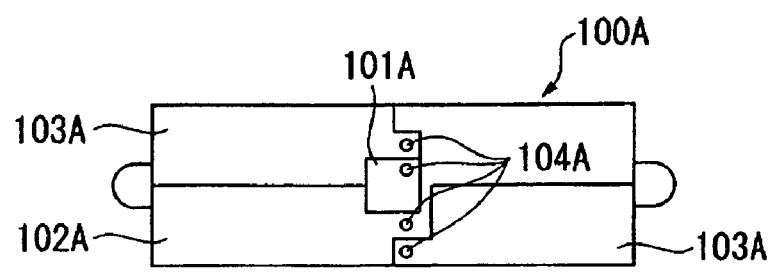
FIG. 14A shows a vibration of the detection electrode of the piezoelectric actuator.

The piezoelectric actuator 100A shown in FIG. 14A has a generally square-shaped detection electrode 101A formed on the surface of the approximate center of the piezoelectric element. Two pairs of generally rectangular drive electrodes 102A, 103A are formed on the portions of the surface of the piezoelectric element other than the portion where the detection electrode 101A is provided, the electrodes of each pair being positioned on diagonally opposite ends of the piezoelectric element. Of the two pairs of drive electrodes 102A, 103A, one pair of drive electrodes 102A is connected together at the approximate center portion of the piezoelectric element so as to form one drive electrode 102A. Thus, this piezoelectric actuator 100A is provided with three drive electrodes 102A, 103A and one detection electrode 101A. Also, in this example, lead wire connecting positions 104A are provided for connecting lead wires to the drive electrodes 102A, 103A and the detection electrode 101A. The lead wires 104A are formed on the drive electrodes 102A, 103A by forming rough spots near the lengthwise middle of the piezoelectric element and arranged in a substantially straight line at the approximate lengthwise middle of the piezoelectric element. This arrangement makes it easier to connect the lead wires to the electrodes. Additionally, since the drive electrodes 102A are connected together at the approximate center of the piezoelectric element, the number of lead wires connected to the piezoelectric element can be reduced and the structure of the piezoelectric actuator can be simplified.

Figure 14B:
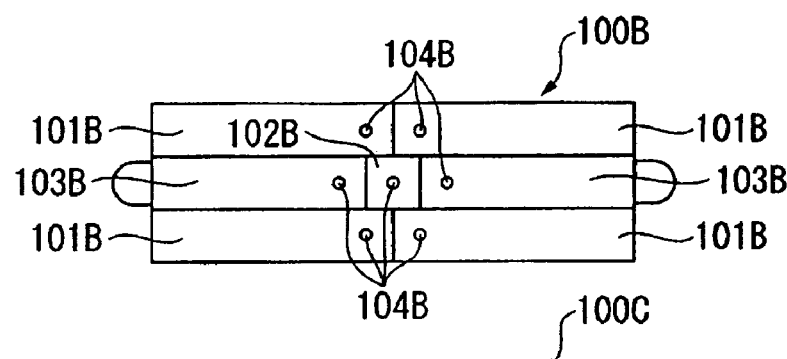
FIG. 14B shows a vibration of the detection electrode of the piezoelectric actuator.

In the piezoelectric actuator 100B shown in FIG. 14B, the piezoelectric element is generally divided into lengthwise thirds by electrodes and the electrode areas on both sides are further divided in two in the widthwise direction so as to form four drive electrodes 101B. A generally square-shaped detection electrode 102B is formed in the approximate center of the piezoelectric element such that the middle electrode area has a pair of drive electrodes 103B located on both sides of the detection electrode 102B. When a voltage is applied to a diagonally opposite pair of drive electrodes 101B and the drive electrodes 103B, the piezoelectric actuator 100B is excited so as to vibrate according to a combination of the longitudinal primary vibration mode and the bending secondary vibration mode. The lead wire connecting positions 104B are preferably concentrated in the approximate middle of the piezoelectric element. Since a vibrational node of the longitudinal primary vibration mode and a vibrational node of the bending secondary vibration mode are located in the approximate middle of the piezoelectric element, the displacement of the piezoelectric actuator 100B is small and the lead wires can be prevented from becoming disconnected, broken, or otherwise disturbed due to the vibration.

Figure 14C:
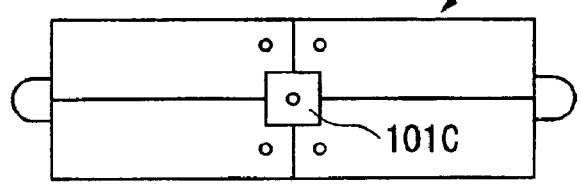
FIG. 14C shows a vibration of the detection electrode of the piezoelectric actuator.

The piezoelectric actuator 100C shown in FIG. 14C has a generally square-shaped detection electrode 101C formed in the same position as the detection electrode 82C of the first embodiment.

Figure 14D:
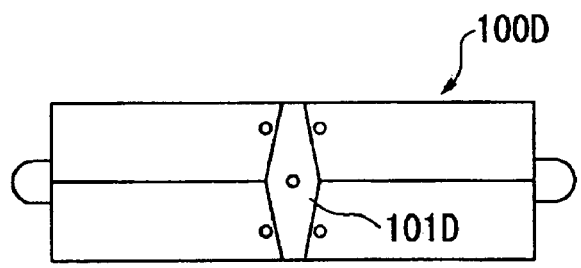
FIG. 14D shows a vibration of the detection electrode of the piezoelectric actuator.

The piezoelectric element 100D shown in FIG. 14D is provided with a detection electrode 101D having a polygonal shape (hexagon).

As illustrated heretofore, any desired shape of detection electrode can be adopted, including but not limited to a substantially square shape, any polygonal shape, a circular shape, an elliptical shape, or an irregular shape.

Figure 14E:
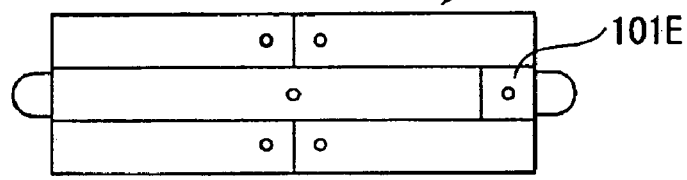
FIG. 14E shows a vibration of the detection electrode of the piezoelectric actuator.
Figure 14F:
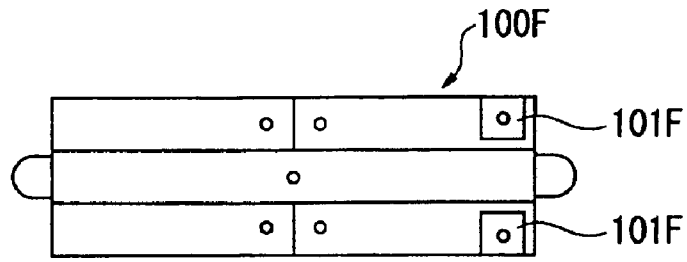
FIG. 14F shows a vibration of the detection electrode of the piezoelectric actuator.

The arrangement of the detection electrode is not limited to a position that includes both a node of the longitudinal primary vibration mode and a node of the bending secondary vibration mode. As shown in FIG. 14E, it is acceptable to form the detection electrode in a position that, for example, includes a vibrational node of the bending secondary vibration mode but does not include a vibrational node of the longitudinal primary vibration mode. In short, when the piezoelectric actuator is operated using chiefly the longitudinal primary vibration mode, the detection electrode should be formed in a position that includes the vibrational nodes of vibration modes other than the longitudinal primary vibration mode, e.g., the bending secondary vibration mode.

Likewise, the arrangement of the detection electrode is not limited to a position that includes a vibrational node of the bending secondary vibration mode; the detection electrode should be formed in a position that includes a vibrational node of another vibration mode when the piezoelectric actuator uses the bending secondary vibration mode as the main vibration mode. In other words, when the piezoelectric actuator uses chiefly the bending secondary vibration mode, the detection electrode can be formed at an end portion of the piezoelectric element in the manner of the detection electrode 101E shown in FIG. 14E or the detection electrode 101F shown in FIG. 14F. That is, when the piezoelectric actuator uses chiefly the bending secondary vibration mode, the detection electrode 101F should be formed so as to include the position where the strain resulting from vibration in the longitudinal primary vibration mode is smallest.

In short the detection electrode should be formed to include the position where the strain resulting from vibration in vibration modes other than the main vibration mode used is the smallest and the phase differences resulting from vibration in vibration modes other than the main vibration mode used are smaller than the target phase difference. The detection electrode need not be arranged such that the position where the strain resulting from vibration in vibration modes other than the main vibration mode is aligned with the geometric center of gravity of the detection electrode; any arrangement is acceptable so long as it includes the position where said strain is the smallest.

Furthermore, even in a case in which the protruding member is arranged on the Y axis, e.g., in the manner of the protruding member 81A of the first embodiment the detection electrode should be arranged in a position where elongated portions and contracted portions caused by vibration modes other than the main vibration mode used are intermingled such that the electric charges occurring at said portions cancel each other out and the phase differences resulting from vibration in vibration modes other than the main vibration mode used are smaller than the target phase difference, as is done in the second embodiment.

Figure 15:
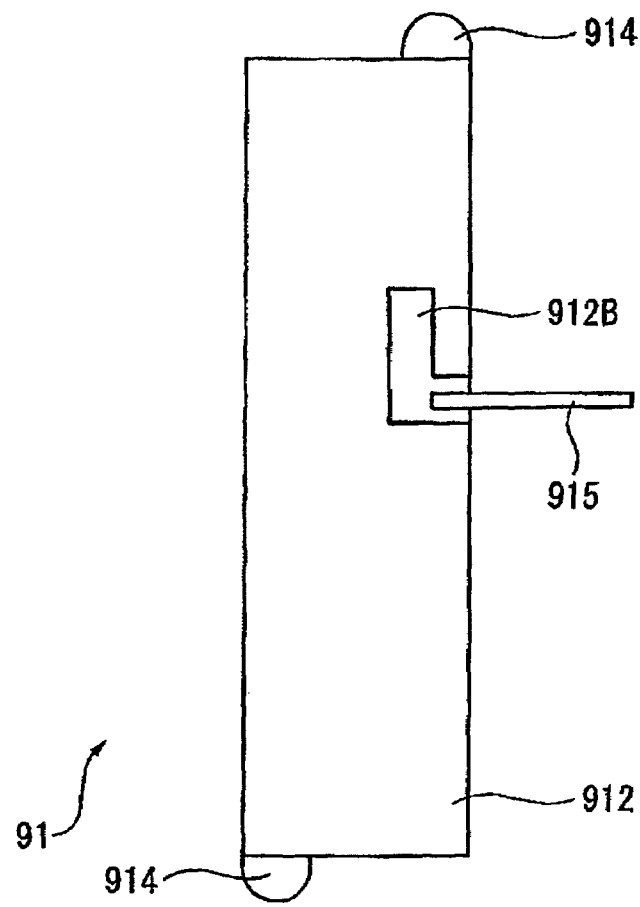
FIG. 15 is a top plan view of a vibration of the detection electrode of the piezoelectric actuator.
Figure 16:
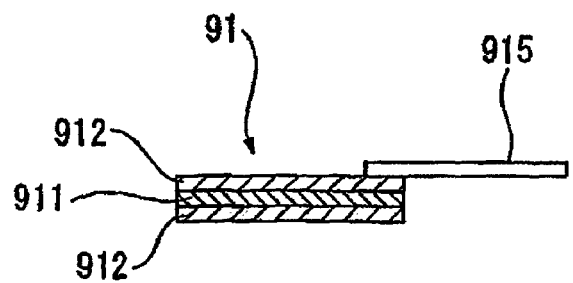
FIG. 16 is a cross sectional view of a vibration of the detection electrode of the piezoelectric actuator.

Also, the shape of the detection electrode 912B formed in a position where elongated and contracted portions are intermingled is not limited to a rectangular shape (four-sided shape). For example, as shown in FIG. 15, the detection electrode can have an L shape in a top plan view. In short, the detection electrode 912B can have any shape so long as it is arranged in a position where positive and negative charges occur and cancel each other out. Also, as shown in FIG. 15, if a portion of the detection electrode 912B is shaped so as to extend to an edge of the piezoelectric element 912, a lead wire or other conductor 915 can be arranged to simply contact the top of the detection electrode 912B and extend sideways from the piezoelectric element 912. This is advantageous because it simplifies the wiring structure.

The vibration modes are not limited to a longitudinal primary vibration mode and a bending secondary vibration mode. A longitudinal secondary vibration mode, a ending primary vibration mode, or any other vibration mode can be employed. The piezoelectric actuator is also not limited to having two vibration modes; instead, it can have three or more vibration modes. When there are two vibration modes, the detection electrode should be formed to include a position where the strain resulting from vibration in the vibration mode that is not the main vibration mode is the smallest. When there are thee or more vibration modes, the detection electrode should be formed to include a position where the strain resulting from vibration in the vibration mode that will have the largest effect on the detection signal among the vibration modes other than the main vibration mode is the smallest. Another approach to handing thee or more vibration modes is to select the vibration mode among the vibration modes other than the main vibration mode that produces a similar detection pattern to the main vibration mode and form the detection electrode so as to include the position where the strain resulting from vibration in the selected vibration mode is the smallest.

Although in the embodiments the initial value Vf1 is set to the upper limit value of a preset adjustment range of the drive frequency, the invention is not limited to such an initial value and it is also acceptable to set the initial value to, for example, the lower limit of the adjustment range of the drive frequency. In either case, since a single drive frequency can be determined with respect to the phase difference, the drive frequency applied to the piezoelectric actuator can be controlled optimally by controlling the phase difference to a prescribed value.

Additionally, although in the previously described embodiments the drive frequency is controlled based on the phase difference between the drive signal and the detection signal, it is also acceptable to control the drive frequency based on the signal level of the detection signal.

Figure 17:
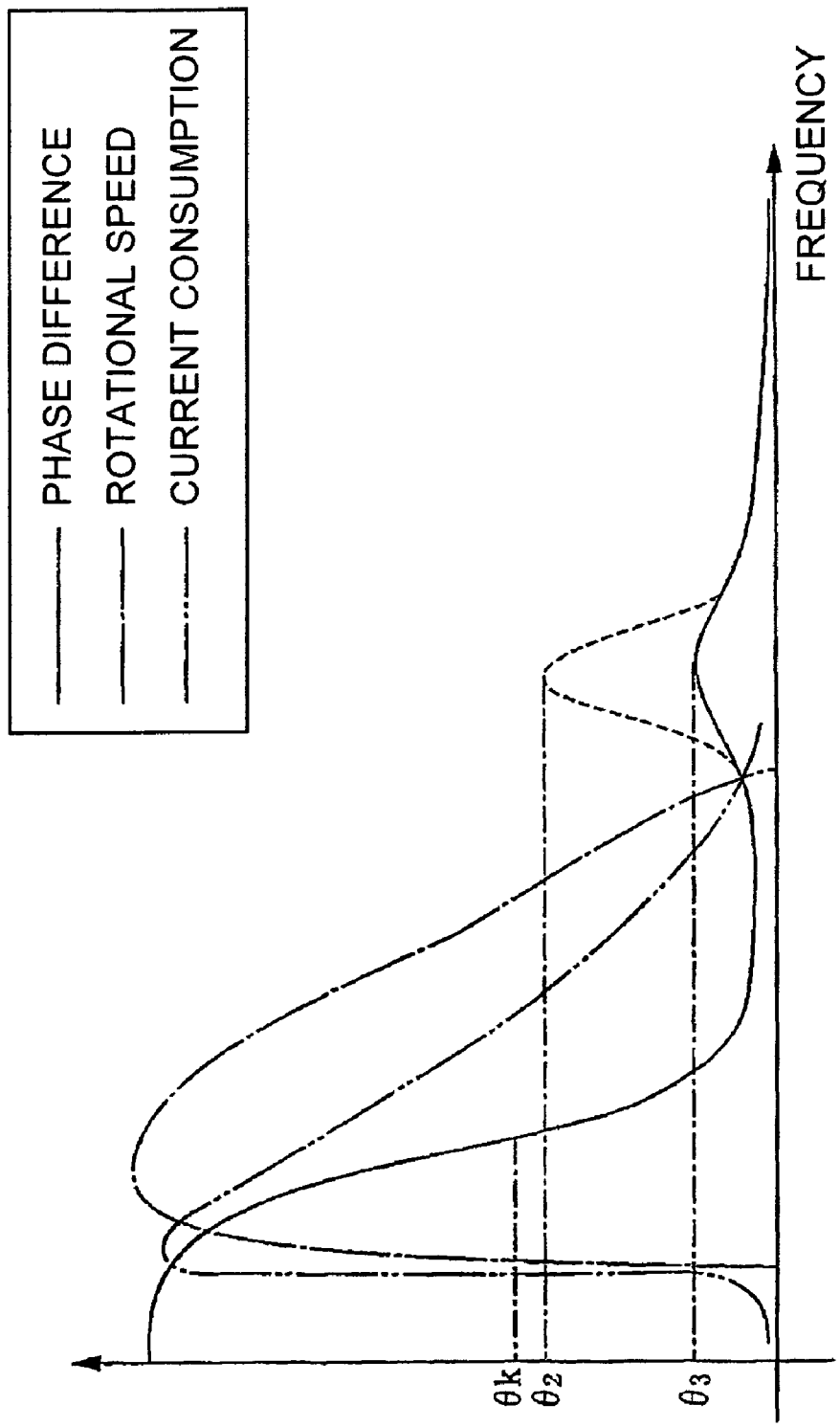
FIG. 17 shows a graph of the phase difference, rotational speed, and electric power consumption versus the drive frequency of the piezoelectric actuator.

More specifically, when the drive frequency is controlled based on the phase difference in the manner of the previously described embodiments, the phase difference where, for example, the rotational speed is the highest is set as a target phase difference θk as shown in FIG. 17 and the drive frequency is adjusted to the frequency where the value of the phase difference resulting from the longitudinal primary vibration mode is equal to the target phase difference θk. Also, the detection electrode is provide in a position where the phase difference resulting from the bending secondary vibration mode is smaller than the target phase difference θk. More specifically, the detection electrode should be arranged such that the phase difference resulting from the bending secondary vibration mode is smaller than the target phase difference θk (like the phase difference θ2 in the figure) and, more preferably, arranged such that the phase difference resulting from the bending secondary vibration mode is 20 degrees or smaller (like the phase difference θ3 shown in the figure).

Figure 18:
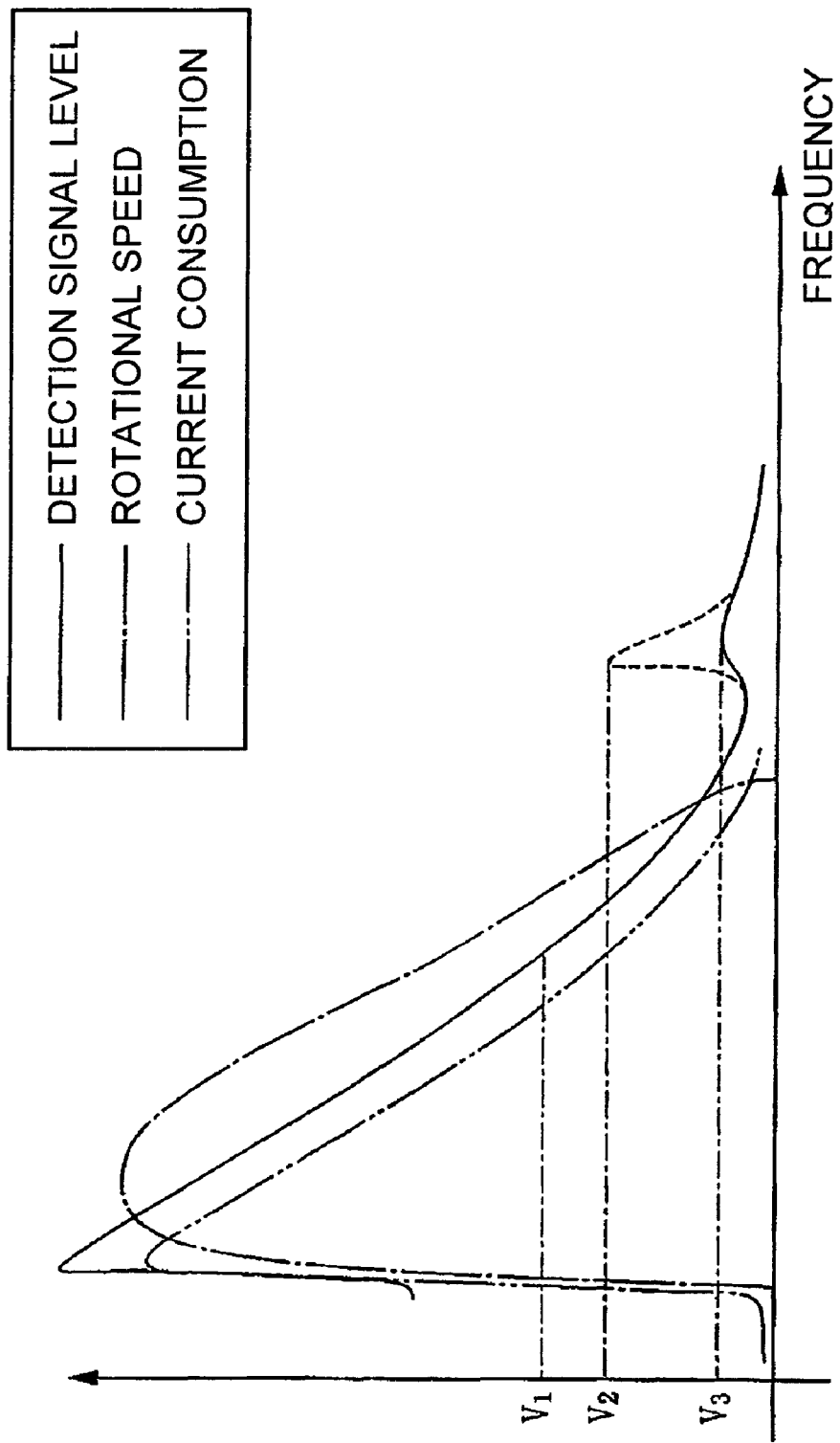
FIG. 18 shows a graph of the detection signal level, rotational speed, and electric power consumption versus the drive frequency of the piezoelectric actuator.

Meanwhile, the drive frequency can also be controlled based on the detection signal level because, as show in FIG. 18, the detection signal level correlates to the rotational speed and electric current consumption in a similar manner to the phase difference. In such a case, the drive frequency should be controlled such that the detection signal level resulting from the longitudinal primary vibration mode is equal to a target level V1. More specifically, the detection electrode should be arranged such that the detection signal level (e.g., V2) resulting from the bending secondary vibration mode is smaller than the target level V1 and, more preferably, arranged such that the detection signal level resulting from the bending secondary vibration mode is approximately 0 (like the detection signal level V3 shown in the figure).

Although the explanations presented heretofore illustrate preferred features for and methods of working the present invention, the present invention is not limited to those features and methods. More specifically, although chiefly specific embodiments are explained and illustrated in the drawings, the shapes, materials, numbers of parts, and other details of the embodiments can be modified by those skilled in the art without departing from the technical idea and scope of the invention.

Thus, descriptions that limit the shapes, material and other features in the preceding explanations are merely intended to serve as examples facilitating the reader's understanding of the invention and are intended not to limit the invention. Shapes, materials, and other features described using part names that eliminate a portion or all of such limitations are also included in the invention.

WORKING EXAMPLE 1

An experiment was conducted in order to confirm the effects of the present invention will now be described.

WORKING EXAMPLE 1

Figure 19:
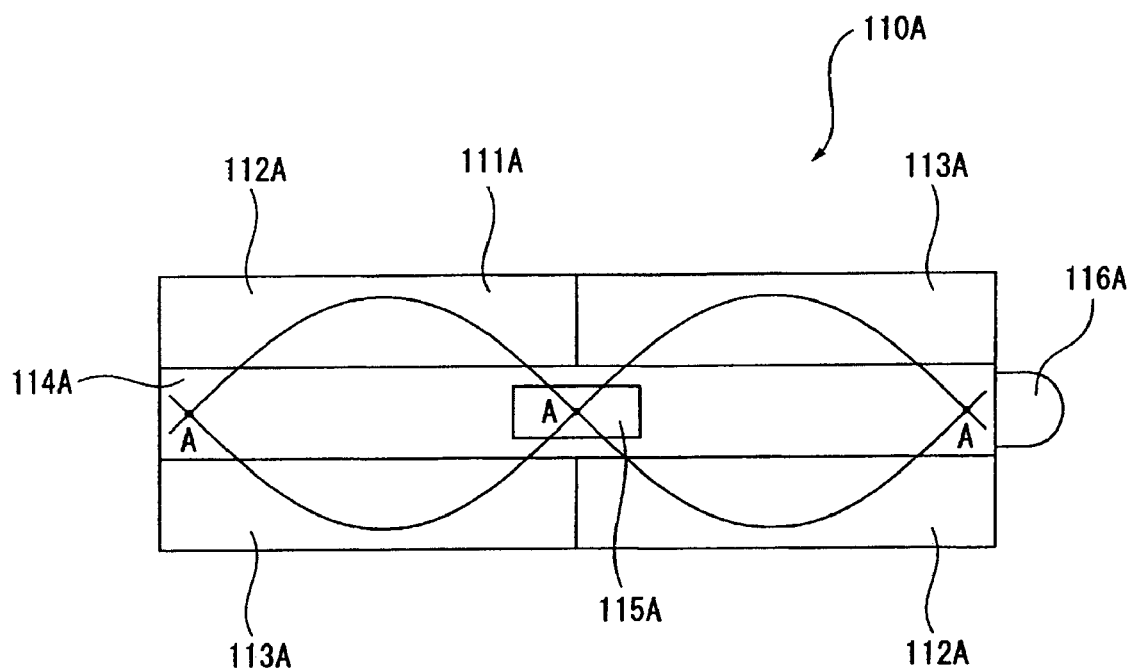
FIG. 19 shows the piezoelectric actuator used in Working Example 1 of the present invention.

The experiment was conducted using the piezoelectric actuator 110A shown in FIG. 19. A plurality of electrodes are electrically insulated from each other by grooves formed in a plating layer on the surface of a piezoelectric element 111A of the piezoelectric actuator 110A and the electrodes are arranged so as to be linearly symmetrical with respect a lengthwise centerline. The piezoelectric element 111A is divided into three approximately equal-sized electrode areas by two lengthwise grooves and the two electrode areas located on both sides are further divided approximately in half by widthwise grooves. Thus, five electrodes are formed on the surface of the piezoelectric element: two diagonally opposite pairs of drive electrodes 112A, 113A and one middle drive electrode 114A A generally rectangular detection electrode 115A is formed inside the drive electrode 114A at the approximate center of the piezoelectric element 111A. The drive electrodes 112A, 113A, 114A and the detection electrode 115A are each connected to a voltage applying apparatus in the same manner as in the first embodiment. When a drive signal is applied to the drive electrodes 112A and 114A, the piezoelectric actuator 110A vibes according to a combination of the longitudinal primary vibration mode and the bending secondary vibration mode and a protruding part 116A vibrates along a generally elliptical path. Meanwhile, if a drive signal is applied to the drive electrodes 113A and 114A, the vibration direction of the bending secondary vibration mode is reversed and the protruding part 116A follows a generally elliptical path in the opposite direction. Thus, a vibrational node of the longitudinal primary vibration mode is located at the point A in the center of the piezoelectric actuator 110A and vibrational nodes of the bending secondary vibration mode are located the three points A located along the lengthwise direction of the piezoelectric actuator 110A. Thus, the detection electrode 115A is formed in such a manner as to include the positions of a vibration node of the longitudinal primary vibration mode and a vibrational node of the bending secondary vibration mode.

The piezoelectric actuator 110A was arms such that the protruding part 116A abutted against the side face of a rotor and the relationship of the rotational velocity of the rotor with respect to the drive frequency of the drive signal was investigated by varying the drive frequency. The relationship of the phase difference between the drive signal and detection signal with respect to the drive frequency was also investigated.

COMPARATIVE EXAMPLE 1

Figure 20:
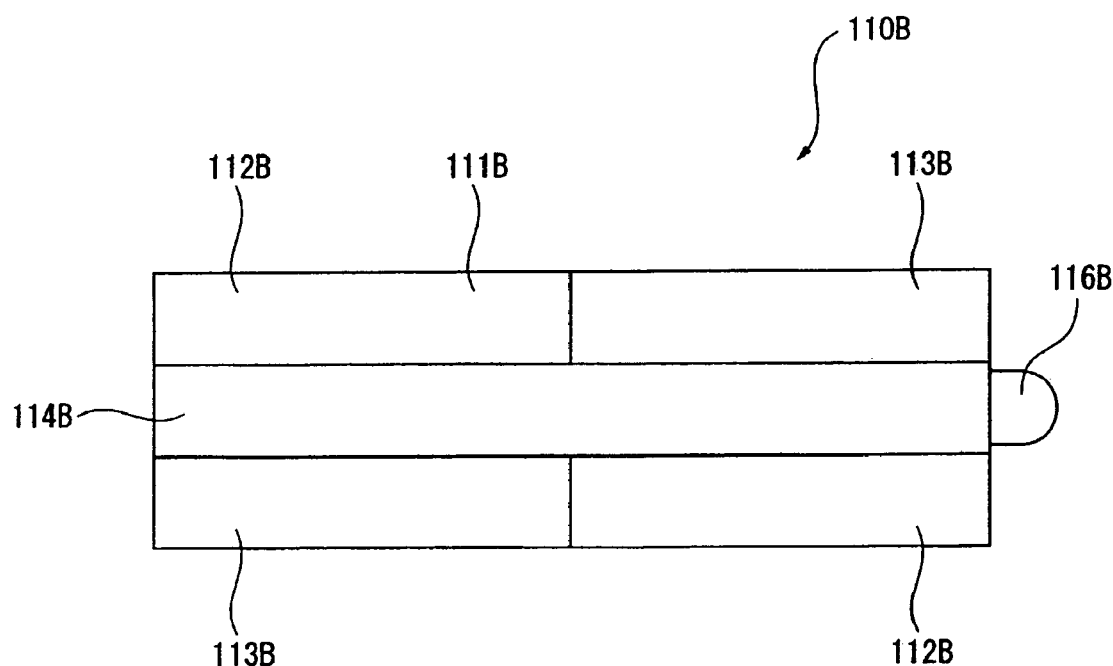
FIG. 20 shows the piezoelectric actuator used in Comparative Example 1 of the present invention.

The experiment of the comparative example was conducted using the piezoelectric actuator 110B shown in FIG. 20. Five drive electrodes 112B, 113B, 114B were formed in the surface of the piezoelectric element 111B of the piezoelectric actuator 110B in the same manner as the electrodes of the piezoelectric actuator 110A of the working example. When the drive signal is applied to the drive electrodes 112B, the drive electrode 113B that is farther from the protruding part 116B is used as the detection electrode; and when the drive signal is applied to the drive electrodes 113B, the drive electrode 112B that is farther from the protruding part 116B is used as the detection electrode.

All other conditions were the same as in the working example.

RESULTING OF WORKING EXAMPLE 1 AND COMPARATIVE EXAMPLE 1

Figure 21:
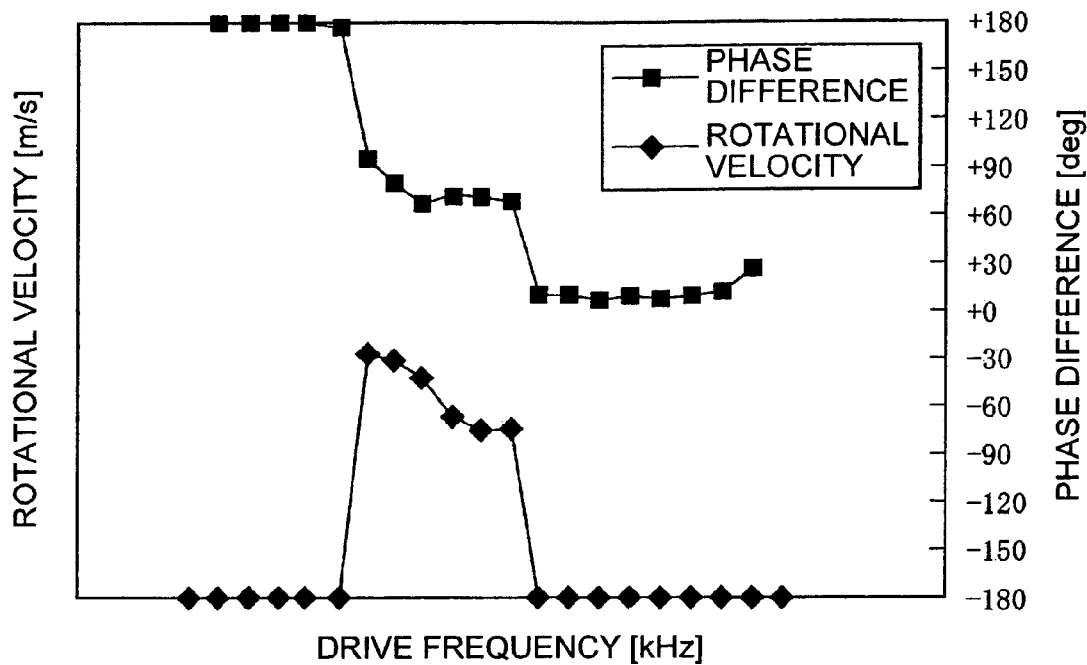
FIG. 21 shows the result of Working Example 1.

The results of the working example are shown in FIG. 21. As shown in FIG. 21, the rotational velocity of the rotor is large within a prescribed range of drive frequencies and zero (i.e., no rotation) at all other drive frequencies. Thus, it is evident that if the drive signal is adjusted to a drive frequency within said range, the rotor can be rotated at a sufficient rotational velocity. Meanwhile, the phase different is approximately 180 degrees in the drive frequency is smaller than the lower limit of the drive frequency range where the rotational velocity of the rotor is large, gradually decreases as the drive frequency increases within said drive frequency range, and ranges from approximately 0 to 30 degrees when the drive frequency is larger than the upper limit of said drive frequency range. Thus, it is evident that with the piezoelectric actuator 110A of the working example, the phase difference gradually decreases as the drive frequency increases and a good rotor rotational velocity can be secured by controlling the drive frequency as appropriate such that the phase difference is, for example, between 70 and 80 degrees. Also, as can be seen in the figure, a single drive frequency can be determined with respect to the phase difference.

Figure 22:
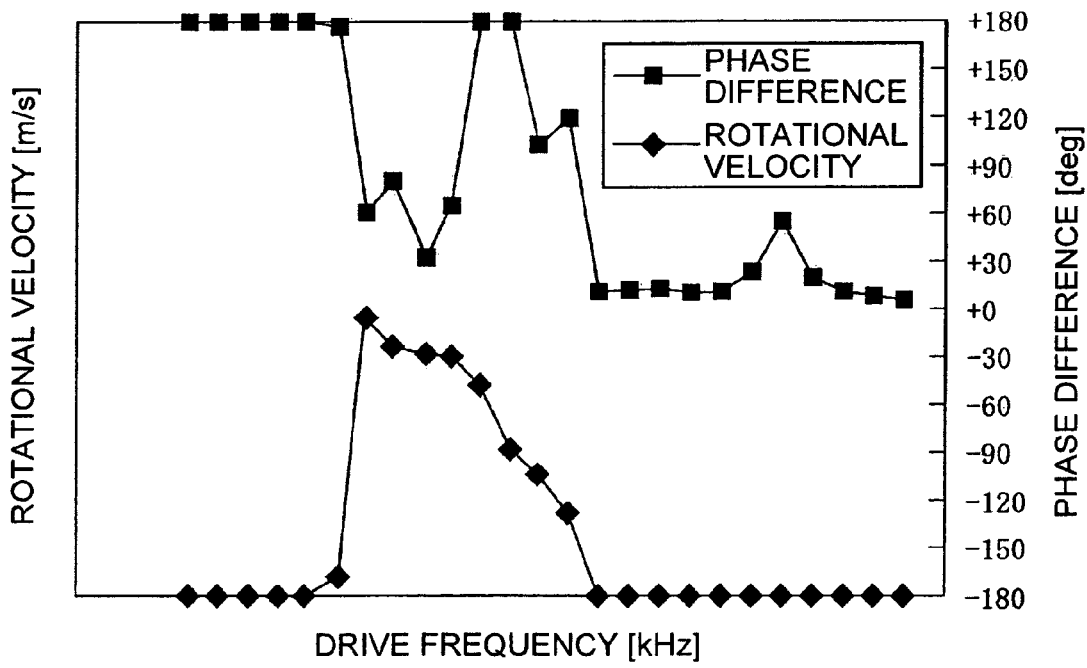
FIG. 22 shows the result of Comparative Example 1.

The results of the comparative example are shown in FIG. 22. As shown in FIG. 22, the rotational velocity of the rotor is large within a prescribed range of drive frequencies, similarly to the working example. However, the phase difference becomes small at a drive frequency near the lower limit of the range of drive frequencies in which the rotational velocity is large and rises again to approximately 180 degrees as the drive frequency increases within said range. Then, the phase difference decreases again as the drive frequency increases further. Consequently, even if one attempts to control the drive frequency such that the phase difference equals a prescribed value between 70 and 80 degrees, there are three drive frequency values that exists with respect to each phase difference value. Thus, although a drive frequency that secures a good rotor rotational velocity can possibly be obtained by setting the drive frequency to one of the three drive frequencies, it will not be possible to maintain a good rotor rotational velocity if the drive frequency is set to one of the other two drive frequencies and the reliability of the rotational drive performance of the rotor will be poor.

In this way, Working Example 1 demonstrates that the present invention has the effect of making a single drive frequency be determined uniquely with respected to a given phase difference, thereby making it possible to always vibrate the piezoelectric actuator at an optimum drive frequency by controlling the drive frequency such that the phase difference between the drive signal and the detection signal equals a prescribed value.

WORKING EXAMPLE 2

This working example was conducted using a piezoelectric actuator in accordance with the second embodiment and observing the phase difference and detection signal level characteristics change when the position of the detection electrode 912B is changed.

WORKING EXAMPLE 2

The experiment was conducted using the piezoelectric actuator 91 shown in FIG. 11. The piezoelectric element 912 of the piezoelectric actuator 91 has the dimensions L1=1.98 mm and L2=7.0 mm and the detection electrode 912B is formed in a rectangular shape joining the four points A' (X, Y)=(0.595, 0.15), B' (X, Y)=(0.891, 0.15), C' (X, Y)=(0.595, 1.73), D' (X, Y)=(0.891, 1.73) such that it lies inside the aforementioned area ABCD.

Figure 23:
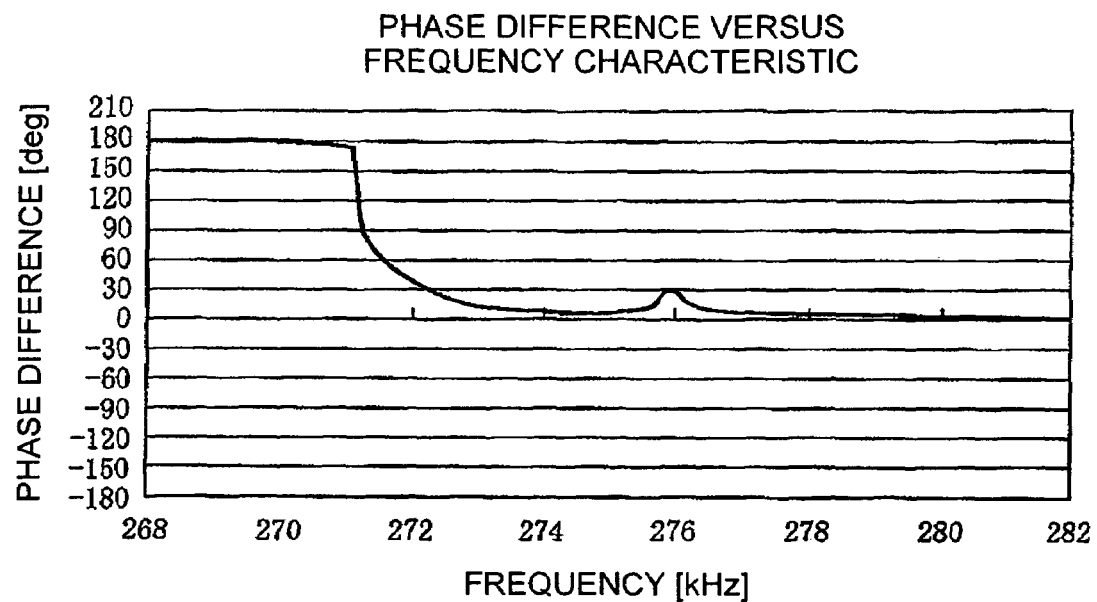
FIG. 23 shows phase difference characteristic results obtained in Working Example 2 of the present invention.
Figure 24:
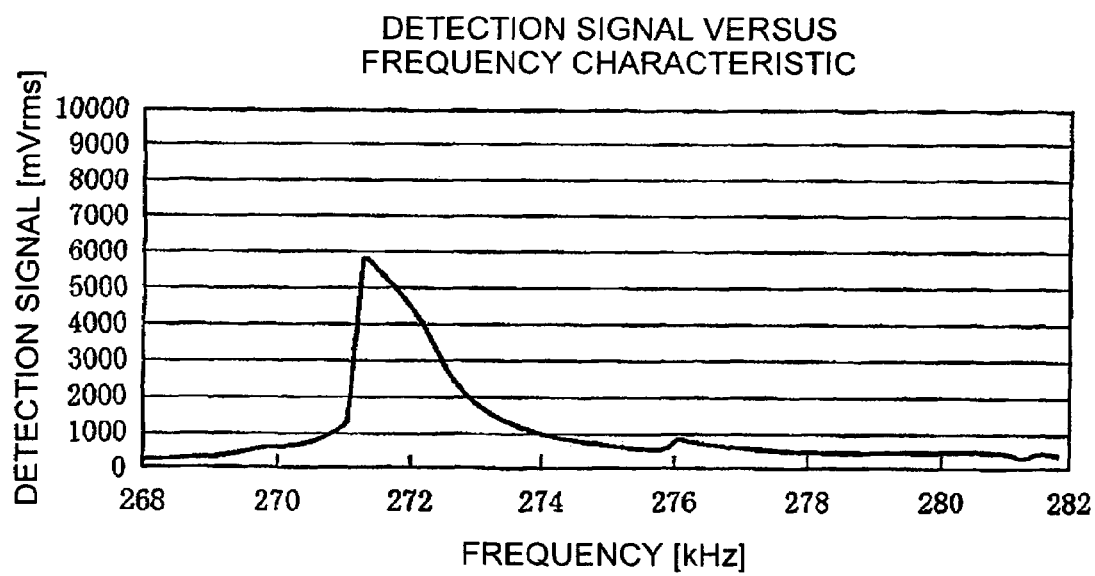
FIG. 24 shows detection signal characteristic results obtained in Working Example 2 of the present invention.

The piezoelectric actuator 91 was arranged such that a protruding part 914 thereof abuts against the side face of a rotor and a phase difference characteristic indicating the phase difference between the drive signal and the detection signal versus the drive frequency and a detection signal characteristic indicating the detection signal level versus the drive frequency were investigated by varying the drive frequency of the drive signal. Graphs of the phase difference characteristic and drive signal characteristic are shown in FIGS. 23 and 24.

COMPARATIVE EXAMPLE 2

Figure 25:
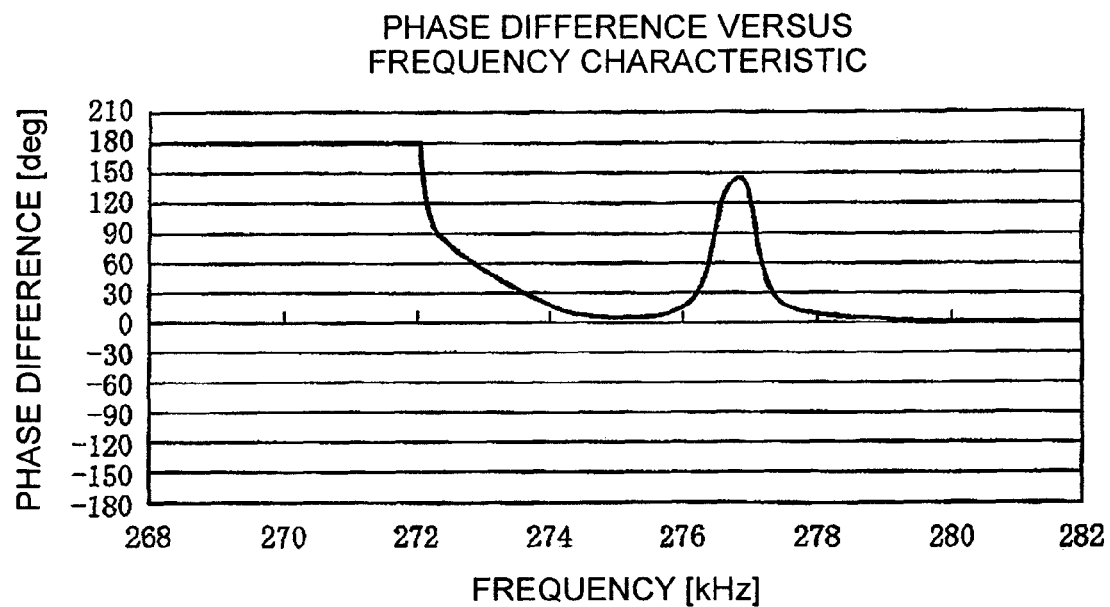
FIG. 25 shows phase difference characteristic results obtained in Comparative Example 2 of the present invention.
Figure 26:
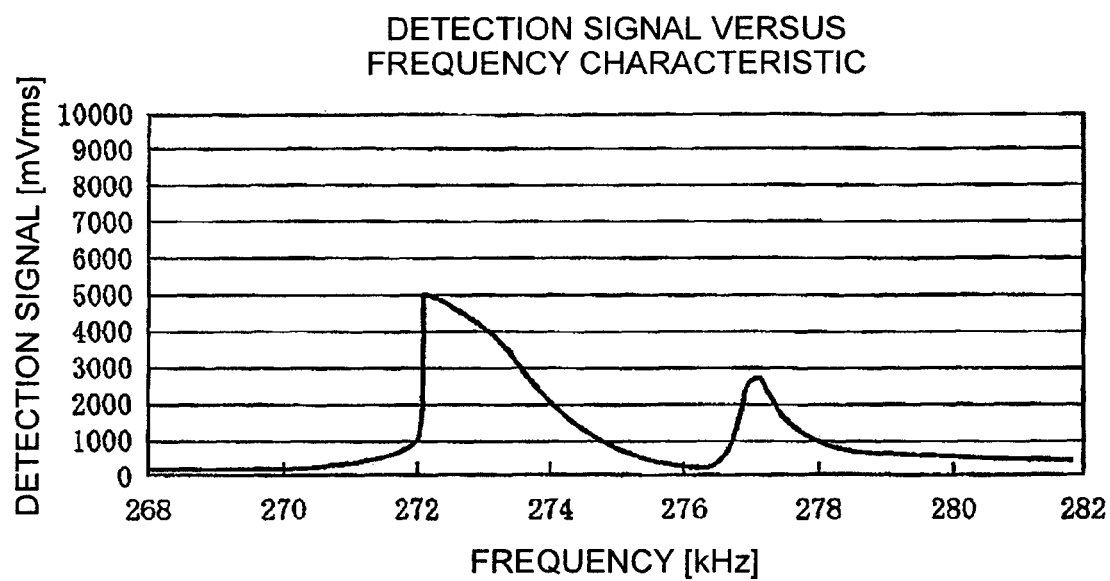
FIG. 26 shows detection signal characteristic results obtained in Comparative Example 2 of the present invention.
Figure 27:
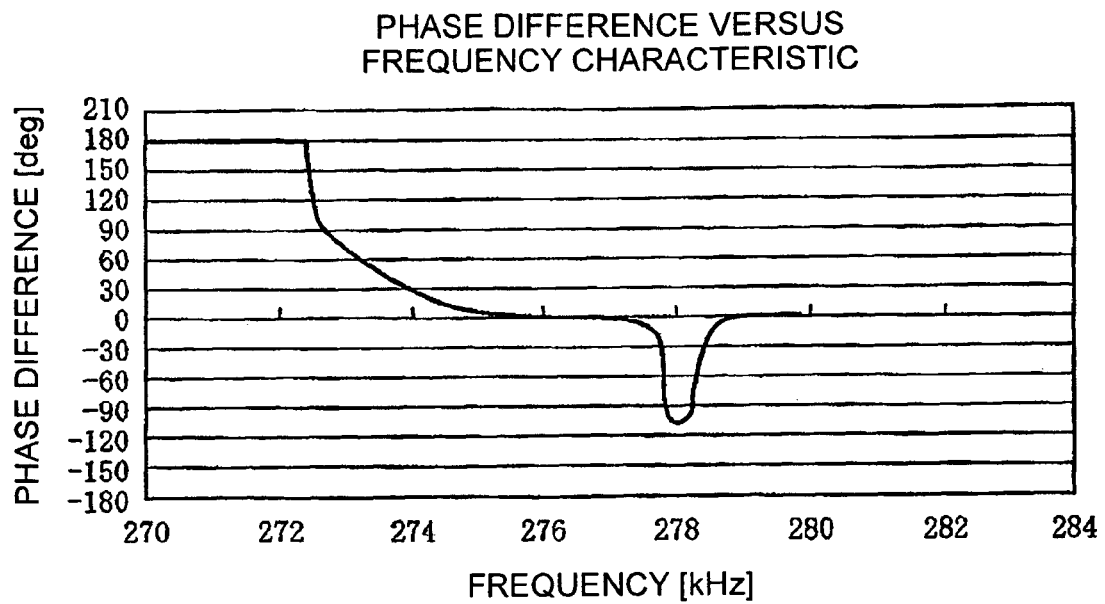
FIG. 27 shows phase difference characteristic results obtained in Comparative Example 2 of the present invention.
Figure 28:
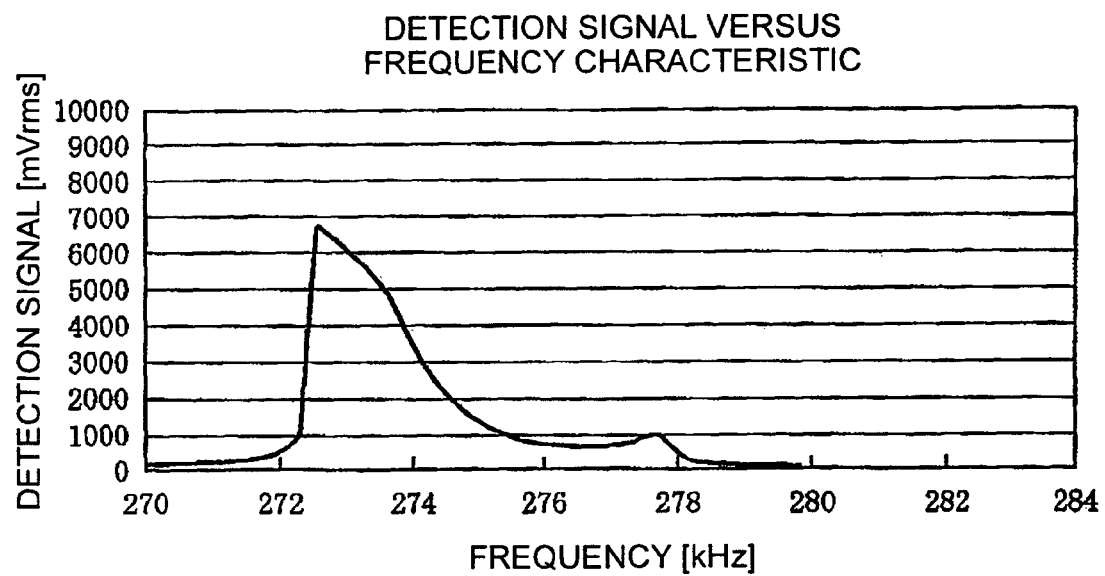
FIG. 28 shows detection signal characteristic results obtained in Comparative Example 2 of the present invention.
Figure 29:
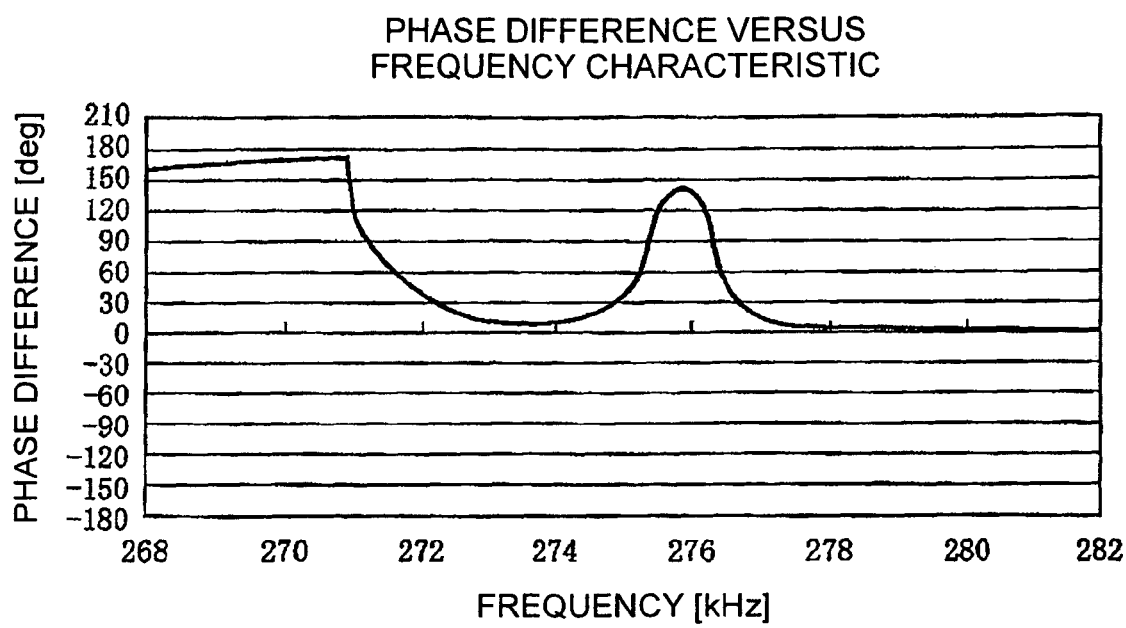
FIG. 29 shows phase difference characteristic results obtained in Comparative Example 2 of the present invention.
Figure 30:
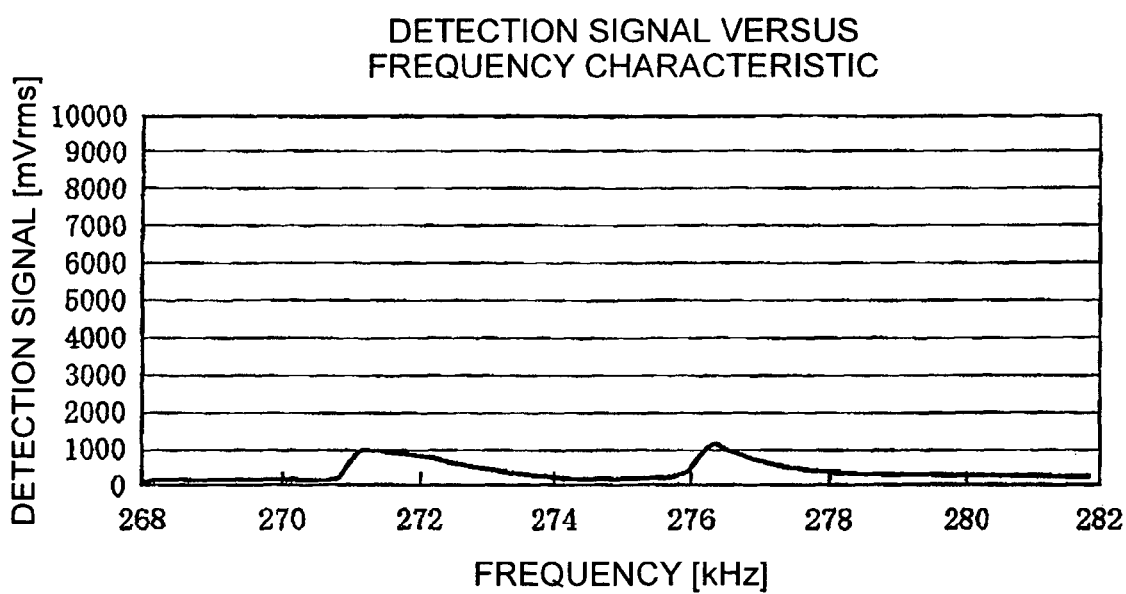
FIG. 30 shows detection signal characteristic results obtained in Comparative Example 2 of the present invention.

Meanwhile, in the comparative example, phase difference characteristic and detection signal characteristic were investigated for different cases in which the position of the detection electrode 912B is shifted away from the area ABCD in the negative X direction, the positive X direction, and the positive Y direction FIGS. 25 and 26 show graphs of the phase difference characteristic and detection signal characteristic for a case in which the position of the detection electrode 912B is shifted the negative X direction; FIGS. 27 and 28 show graphs of the phase difference characteristic and detection signal characteristic for a case in which the position of the detection electrode 912B is shifted in the positive X direction; and FIGS. 29 and 30 show graphs of the phase difference characteristic and detection signal characteristic for a case in which the position of the detection electrode 912B is shifted in the positive Y direction.

RESULT OF WORKING EXAMPLE 2 AND COMPARATIVE EXAMPLE 2

As shown in FIGS. 23 to 30, when the detection electrode 912B is formed inside the prescribed area ABCD, the phase difference signal resulting from the bending secondary vibration mode is very small and it is clear that a single drive frequency can be determined when a target phase difference is set.

Conversely, when the detection electrode 912B is shift from the area ABCD in the negative X direction or positive Y direction the phase difference signal resulting from the bending secondary vibration mode becomes larger and two drive frequencies exist with respect to a given set target phase difference. Under these conditions, there will be some cases in which the piezoelectric actuator 91 is driven with the drive frequency having the poorer drive characteristic.

Similarly, regarding the detection signal level, when the detection electrode 912B is formed inside the prescribed area ABCD, a detection signal having a sufficient level is obtained. However, when the detection electrode 912B is shifted in the negative X direction, a signal having a comparatively high level is outputted due to the bending secondary vibration mode, too, causing obvious problems from the standpoint of controlling the drive frequency based on the detection signal level. Additionally, when the detection electrode 912B is shift in the positive Y direction, the detection signal level is very small and thus problematic from the standpoint of controlling the drive frequency based on the detection signal level.

In this way, Working Example 2 demonstrates that the present invention achieves the effect of making a single drive frequency be determined uniquely with respect to a given phase difference or detection signal level by forming the detection electrode 912B in a position where the electric charges occurring at portions that are elongated due to the bending secondary vibration mode and portions that are contracted due to the bending secondary vibration mode can cancel one another out. As a result, the piezoelectric actuator can always be vibrated at an optimum drive frequency by controlling the drive frequency such that the phase difference between the drive signal and the detection signal equals a prescribed value or such that the detection signal level equals a prescribed value.

Such directional terms as "front," "back," "over," "under," "perpendicular," "horizontal," and "diagonal" as used herein serve to indicate directions within the drawings used to illustrate the invention. Therefore, directional terms used herein to describe the invention should be interpreted in a relative manner within the context of the drawings. Also, such terms of degree as "substantially", "about" and "approximately" as used herein mean a reasonable amount of deviation of the modified term such that the end result is not significantly changed. These terms of degree can be construed as including a deviation of at least ±5% of the modified term so long as this deviation would not significantly change the end result.

All the disclosure in Japanese Patent Application No. 2004-200794 are incorporated herein by reference.

The embodiments presented herein represent only a portion of the potential embodiments of the present invention and, based on this disclosure, it should be clear to those skilled in the art that a variety of modifications can be applied to the embodiments presented herein without exceeding the scope of the invention as defined in the claims The embodiments presented herein are provided solely for the purpose of describing the invention and does not limit the invention as defined by the appended claims and their equivalents.

The invention claimed is:

1. A piezoelectric drive apparatus, comprising:
    a piezoelectric element having at least a main vibration mode and a subordinate vibration mode;
    a drive electrode that is formed on said piezoelectric element and configured to have a drive signal applied thereto for vibrating said piezoelectric element;
    a detection electrode configured to detect a detection signal of said piezoelectric element and formed on said piezoelectric element in a position where phase difference between said drive signal and said detection signal resulting from said subordinate vibration mode is smaller than a target phase difference or a position where said signal level of said detection signal resulting from said subordinate vibration mode is smaller than a target signal level; and a control unit configured to control said drive signal to keep said phase difference not larger than a target phase difference.

2. The piezoelectric drive apparatus recited in claim 1, wherein said main vibration mode is a longitudinal vibration mode in which said piezoelectric actuator elongates and contracts in the lengthwise direction of said vibrating body; and said subordinate vibration mode is a bending vibration mode in which said piezoelectric actuator bends in a direction substantially perpendicular to said vibration direction of said main vibration mode.

3. The piezoelectric drive apparatus recited in claim 2, wherein said detection electrode is formed in a position where both portions where said piezoelectric element elongates in relation to said subordinate vibration mode and portions where said piezoelectric element contracts in relation to said subordinate vibration mode occur simultaneously, and electric charges that occur at said elongated portions and electric charges that occur at said contracted portions cancel one another out.

4. The piezoelectric drive apparatus recited in claim 1, wherein said drive electrode is divided into four drive electrodes by a first groove running generally along a lengthwise centerline of said piezoelectric element and a second groove running generally along a widthwise centerline of said piezoelectric element, said groves serving to separate said individual drive electrodes.

5. The piezoelectric drive apparatus recited in claim 1, wherein said detection electrode is formed in a position where said phase difference is 20 degrees or less.

6. The piezoelectric drive apparatus recited in claim 1, wherein said detection electrode is formed in such a manner as to occupy an area that includes said position where strain resulting from said subordinate vibration mode is smallest.

7. The piezoelectric drive apparatus recited in claim 1, wherein said detection electrode is formed in such a manner as to occupy an area that includes a vibrational node of said subordinate vibration mode.

8. The piezoelectric drive apparatus recited in claim 1, wherein the surface area of said detection electrode is equal to or larger than $1/30$ and smaller than or equal to $1/7$ of said surface area of said drive electrode.

9. The piezoelectric drive apparatus recited in claim 8, wherein said surface area of said detection electrode is equal to or larger than $1/15$ and smaller than or equal to $1/10$ of said surface area of said drive electrode.

10. A piezoelectric drive apparatus, comprising:

a reinforcing plate having the form of a generally rectangular flat plate;

a first piezoelectric element that is formed on one main surface of said reinforcing plate and configured to have at least a main vibration mode and a subordinate vibration mode;

a first drive electrode that is formed on said first piezoelectric element and configured to have a drive signal applied thereto for vibrating said first piezoelectric element;

a second piezoelectric element that is formed on the other main surface of said reinforcing plate and configured to have at least said main vibration mode and said subordinate vibration mode;

a second drive electrode that is formed on said second piezoelectric element and configured to have said drive signal applied thereto for vibrating said second piezoelectric element;

a detection electrode that is formed on said first piezoelectric element in a position where phase difference between said drive signal and said detection signal resulting from said subordinate vibration mode is smaller than a target phase difference or a position where the signal level of said detection signal resulting from said subordinate vibration mode is smaller than a target signal level; and a control unit configured to control said drive signal to keep said phase difference not larger than a target phase difference.

11. The piezoelectric drive apparatus recited in claim 10, wherein said reinforcing plate is further provided with a pair of protruding members, and one of said protruding members is formed at the approximate middle of each of the two shorter sides of said generally rectangular reinforcing plate.

12. The piezoelectric drive apparatus recited in claim 10, wherein said protruding members are formed substantially at diagonally opposite corners of said piezoelectric actuator.

13. The piezoelectric drive apparatus recited in claim 10, wherein said reinforcing plate is further provided with a pair of fastening-purpose arm parts that outwardly protrude from the approximate lengthwise middle of said reinforcing plate.

14. A piezoelectric drive apparatus, comprising:

a piezoelectric element having at least a main vibration mode and a subordinate vibration mode;

a drive electrode that is formed on said piezoelectric element and configured to have a drive signal applied thereto for vibrating said piezoelectric element;

a detection electrode that is for detecting a detection signal of said piezoelectric element and formed on said piezoelectric element in a position where phase difference between said drive signal and said detection signal resulting from said subordinate vibration mode is smaller than a target phase difference or a position where the signal level of said detection signal resulting from said subordinate vibration mode is smaller than a target signal level; and a control means configured to control said drive signal based on either said phase difference or said detection signal level, said control means include a phase difference—voltage converting circuit configured to detect said phase difference between a first phase that is said phase of said detection signal detected at said detection electrode and a second phase that is said phase of said drive signal applied to said drive electrodes and generates a phase difference voltage signal having a voltage value equivalent to an average phase difference, a constant voltage means configured to output a prescribed reference phase difference signal having a voltage value equivalent to said target phase difference;

a comparing means configured to compare said phase difference voltage signal and said reference phase difference signal, and a driver means configured to apply a drive signal to said drive electrode based on the result of the comparison executed by said comparing means.

15. The piezoelectric drive apparatus recited in claim 14, wherein said phase difference—voltage conversion means includes a phase difference detecting means configured to generate and output a phase difference signal having a pulse width equivalent to said phase difference, and an average voltage converting means configured to generate a phase difference voltage signal having an average voltage value equivalent to the pulse width of said phase difference signal and output said phase difference voltage signal to said comparing means.

16. A device, comprising:

a driven body configured to be driven by another entity; and a piezoelectric actuator that is connected to said driven body and serves to drive said driven body, said piezoelectric drive device including a piezoelectric element having at least a main vibration mode and a subordinate vibration mode, a drive electrode that is formed on said piezoelectric element and configured to have a drive signal applied thereto for the purpose of vibrating said piezoelectric element, a detection electrode configured to detect a detection signal of said piezoelectric element and formed on said piezoelectric element in a position where said phase difference between said drive signal and said detection signal resulting from said subordinate vibration mode is smaller than a target phase difference or a position where the signal level of said detection signal resulting from said subordinate vibration mode is smaller than a target signal level, and a control unit configured to control said drive signal to keep said phase difference not larger than a target phase difference.

17. The device recited in claim 16, wherein said driven body includes a rotational body against which said piezoelectric actuator abuts; and a lens configured and arranged to be driven by the rotational motion of said rotational body.

18. The device recited in claim 16, wherein said driven body includes a rotational body against which said piezoelectric actuator abuts; and a time indicating part configured and arranged to be driven by the rotational motion of said rotational body.

19. The device recited in claim 18, wherein said time indicating part is configured to indicate at least one of hour, minute, second, and date.

* * * * *